US011848534B2

(12) United States Patent
Batchelder et al.

(10) Patent No.: US 11,848,534 B2
(45) Date of Patent: Dec. 19, 2023

(54) ADDITIVE MANUFACTURING SYSTEM WITH LASER ASSEMBLY

(71) Applicant: Evolve Additive Solutions, Inc., Minnetonka, MN (US)

(72) Inventors: J. Samuel Batchelder, Somers, NY (US); Moshe Aknin, Modi'in-Maccabim-Reut (IL); Jonathan B. Hedlund, Blaine, MN (US)

(73) Assignee: Evolve Additive Solutions, Inc., Minnetonka, MN (US)

( * ) Notice: Subject to any disclaimer, the term of this patent is extended or adjusted under 35 U.S.C. 154(b) by 219 days.

(21) Appl. No.: 15/529,371

(22) PCT Filed: Nov. 24, 2015

(86) PCT No.: PCT/US2015/062388
§ 371 (c)(1),
(2) Date: May 24, 2017

(87) PCT Pub. No.: WO2016/085965
PCT Pub. Date: Jun. 2, 2016

(65) Prior Publication Data
US 2017/0271843 A1 Sep. 21, 2017

Related U.S. Application Data

(60) Provisional application No. 62/083,553, filed on Nov. 24, 2014.

(51) Int. Cl.
*H01S 5/024* (2006.01)
*B33Y 30/00* (2015.01)
(Continued)

(52) U.S. Cl.
CPC ........ *H01S 5/02469* (2013.01); *B29C 64/135* (2017.08); *B29C 64/268* (2017.08);
(Continued)

(58) Field of Classification Search
CPC ... B29C 64/227; B29C 64/232; B29C 64/291; B29C 64/277; B29C 64/135;
(Continued)

(56) References Cited

U.S. PATENT DOCUMENTS 5,495,490 A 2/1996 Rice et al.
6,324,190 B1 * 11/2001 Du .................. G02B 27/09
372/8

(Continued)

FOREIGN PATENT DOCUMENTS

WO 2008118263 A1 10/2008
WO 2014199149 A1 12/2014
WO 2014199150 A1 12/2014

OTHER PUBLICATIONS

International Search Report and Written Opinion dated Mar. 1, 2016 for International Application No. PCT/US2015/062388, filed Nov. 24, 2015.
(Continued)

*Primary Examiner* — Philip C Tucker
*Assistant Examiner* — Jimmy R Smith, Jr.
(74) *Attorney, Agent, or Firm* — Pauly, DeVries Smith & Deffner LLC

(57) ABSTRACT

A laser assembly for use with an additive manufacturing system, which includes a base block configured to be moved along a scan direction axis in the additive manufacturing system, a plurality of laser emitters preferably arranged in an array of at least two rows of two or more laser emitters. At least a portion of a heat sink assembly is configured to draw heat away from the base block and/or the laser emitters. The assembly includes a controller assembly a controller assembly configured to control a movement of the base block along the first axis and to independently control at least timing and duration of energy emitted from each laser
(Continued)

emitter of the plurality of laser emitters as the base block moves along the first axis.

9 Claims, 24 Drawing Sheets

(51) Int. Cl.
| | |
|---|---|
| *B33Y 10/00* | (2015.01) |
| *B29C 64/386* | (2017.01) |
| *B29C 64/268* | (2017.01) |
| *B29C 64/393* | (2017.01) |
| *H01S 5/00* | (2006.01) |
| *H01S 5/40* | (2006.01) |
| *H01S 5/02* | (2006.01) |
| *B29C 64/135* | (2017.01) |
| *H01S 5/02325* | (2021.01) |
| *B33Y 50/02* | (2015.01) |
| *H01S 5/042* | (2006.01) |
| *H01S 5/02212* | (2021.01) |
| *B29K 105/24* | (2006.01) |

(52) U.S. Cl.
CPC .......... *B29C 64/386* (2017.08); *B29C 64/393* (2017.08); *B33Y 10/00* (2014.12); *B33Y 30/00* (2014.12); *B33Y 50/02* (2014.12); *H01S 5/005* (2013.01); *H01S 5/02* (2013.01); *H01S 5/02325* (2021.01); *H01S 5/02423* (2013.01); *H01S 5/042* (2013.01); *H01S 5/405* (2013.01); *H01S 5/4025* (2013.01); *B29K 2105/24* (2013.01); *H01L 2224/48091* (2013.01); *H01S 5/02212* (2013.01)

(58) Field of Classification Search
CPC ..... B29C 64/268; B29C 64/386; B33Y 30/00; B33Y 10/00; B33Y 50/02; H01S 5/005; H01S 5/02; H01S 5/02212; H01S 5/02325; H01S 5/02423; H01S 5/02469; H01S 5/042; H01S 5/4025; H01S 5/405; H01L 2224/48091; H01L 2924/00014; B29K 2105/24

See application file for complete search history.

(56) References Cited

U.S. PATENT DOCUMENTS

| | | | |
|---|---|---|---|
| 7,145,927 B2 | 12/2006 | Rice | |
| 2003/0052105 A1 | 3/2003 | Nagano et al. | |
| 2003/0214571 A1 | 11/2003 | Ishikawa et al. | |
| 2005/0084620 A1* | 4/2005 | Schuurman | B29C 64/129 427/180 |
| 2005/0152146 A1* | 7/2005 | Owen | A61L 2/10 362/294 |
| 2005/0288813 A1* | 12/2005 | Yang | B22F 3/1055 700/119 |
| 2009/0017219 A1* | 1/2009 | Paasche | B22F 3/003 427/466 |
| 2009/0224438 A1* | 9/2009 | Stampfl | G03F 7/426 264/496 |
| 2010/0125356 A1* | 5/2010 | Shkolnik | B33Y 80/00 700/118 |
| 2012/0287954 A1 | 11/2012 | Saruwatari et al. | |
| 2014/0198365 A1 | 7/2014 | Li et al. | |
| 2015/0266242 A1* | 9/2015 | Comb | B29C 64/393 264/40.1 |

OTHER PUBLICATIONS

Griffiths, Lauren, "Fraunhofer Institute for Laser Technology to present SLM concept at EuroMold", Rapid News Publications LTD, Nov. 18, 2014.

Fraunhofer Institute for Laser Technology ILT (2014), "Selective laser metling: New machine design and exposure concept facilitates scalable productivity and building space", (Press Release) Retrieved from www.ilt.fraunhofer.de.

\* cited by examiner

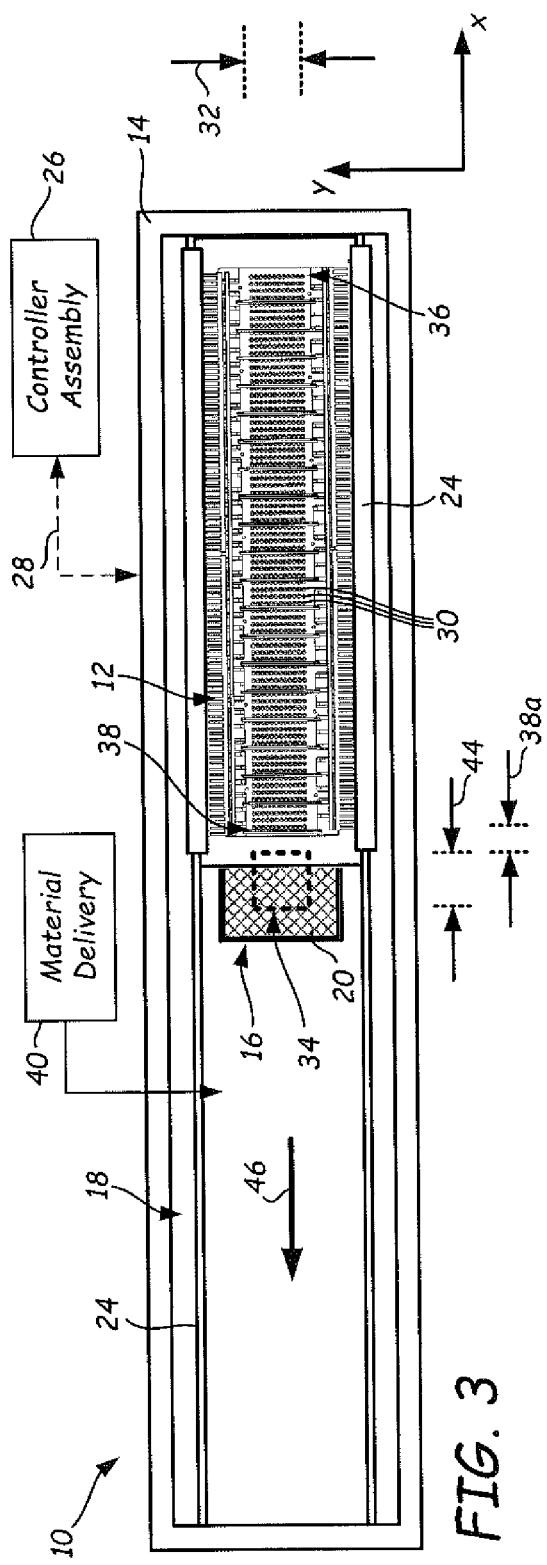
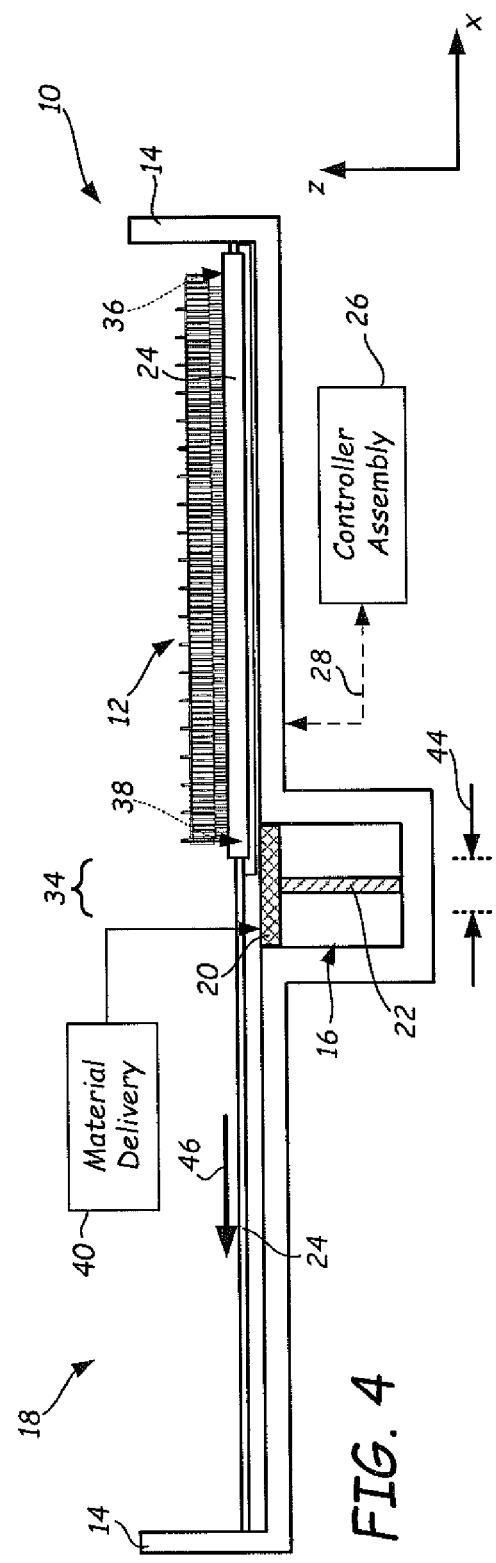
FIG. 3
FIG. 4

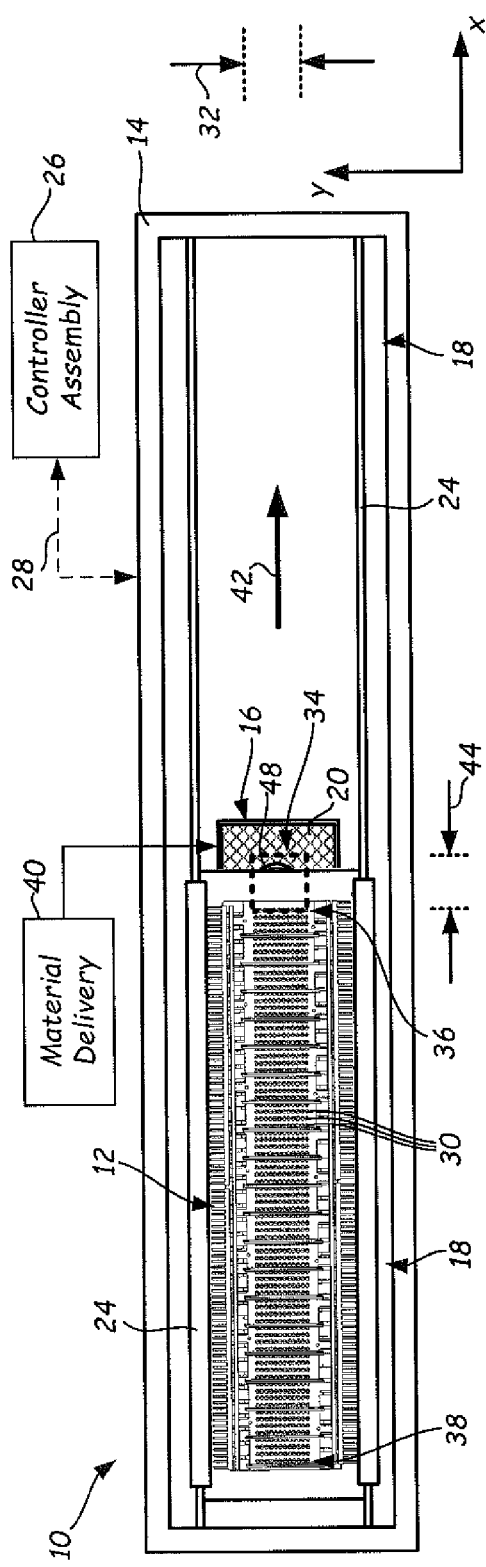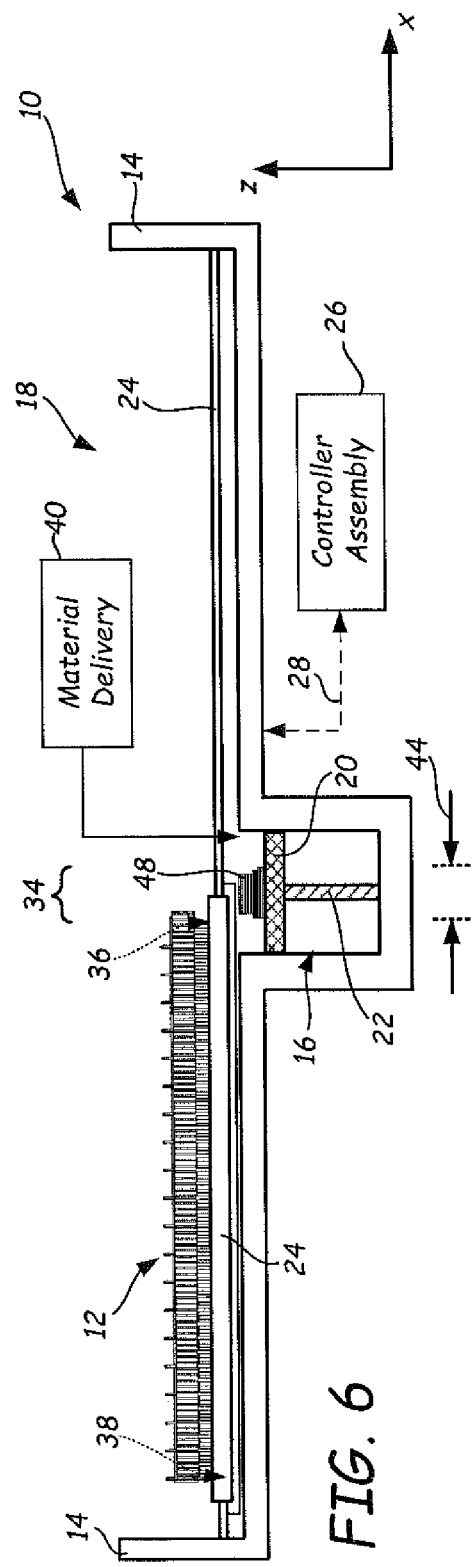

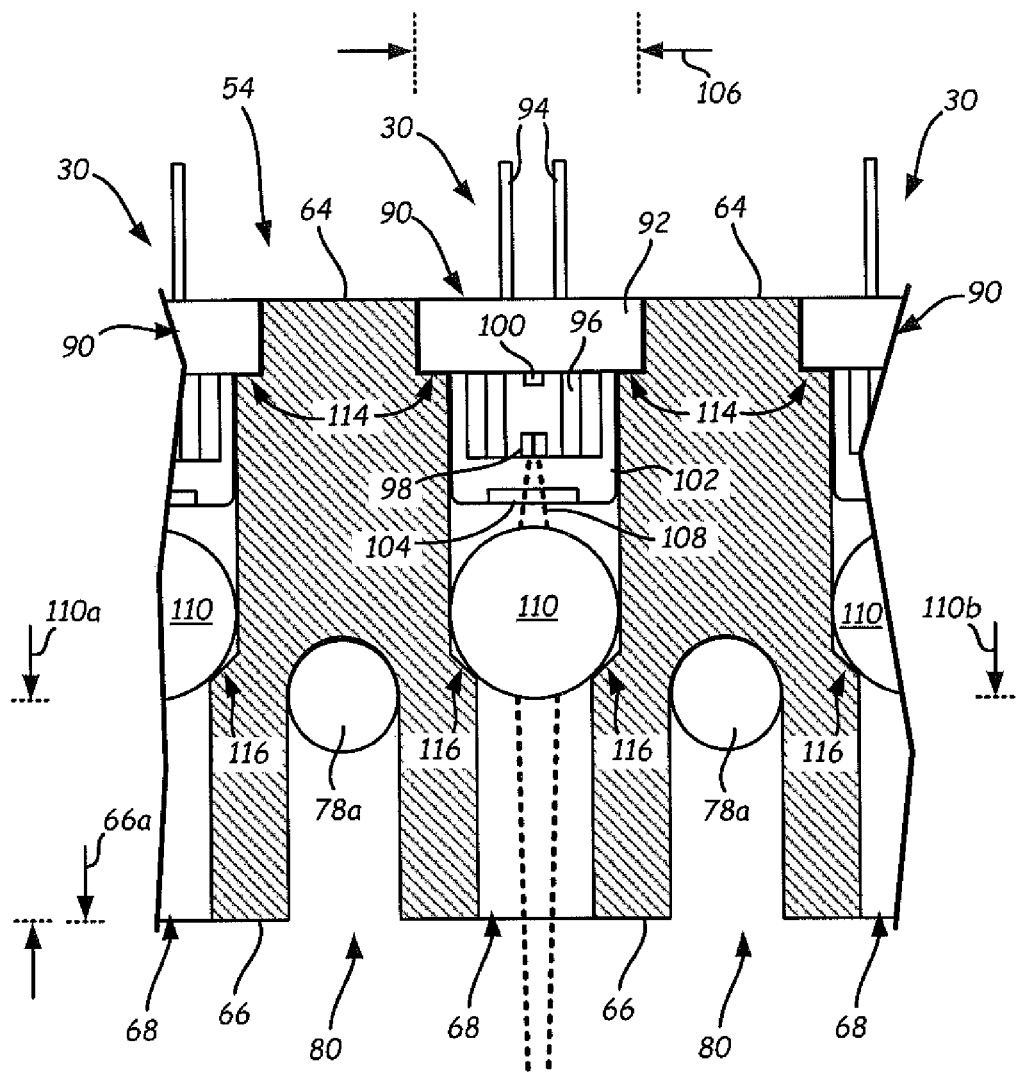
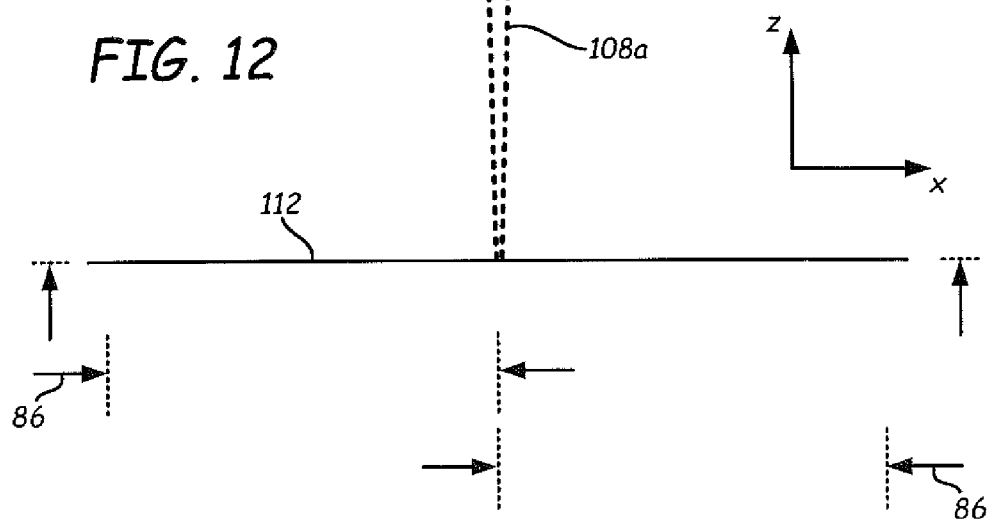
FIG. 12

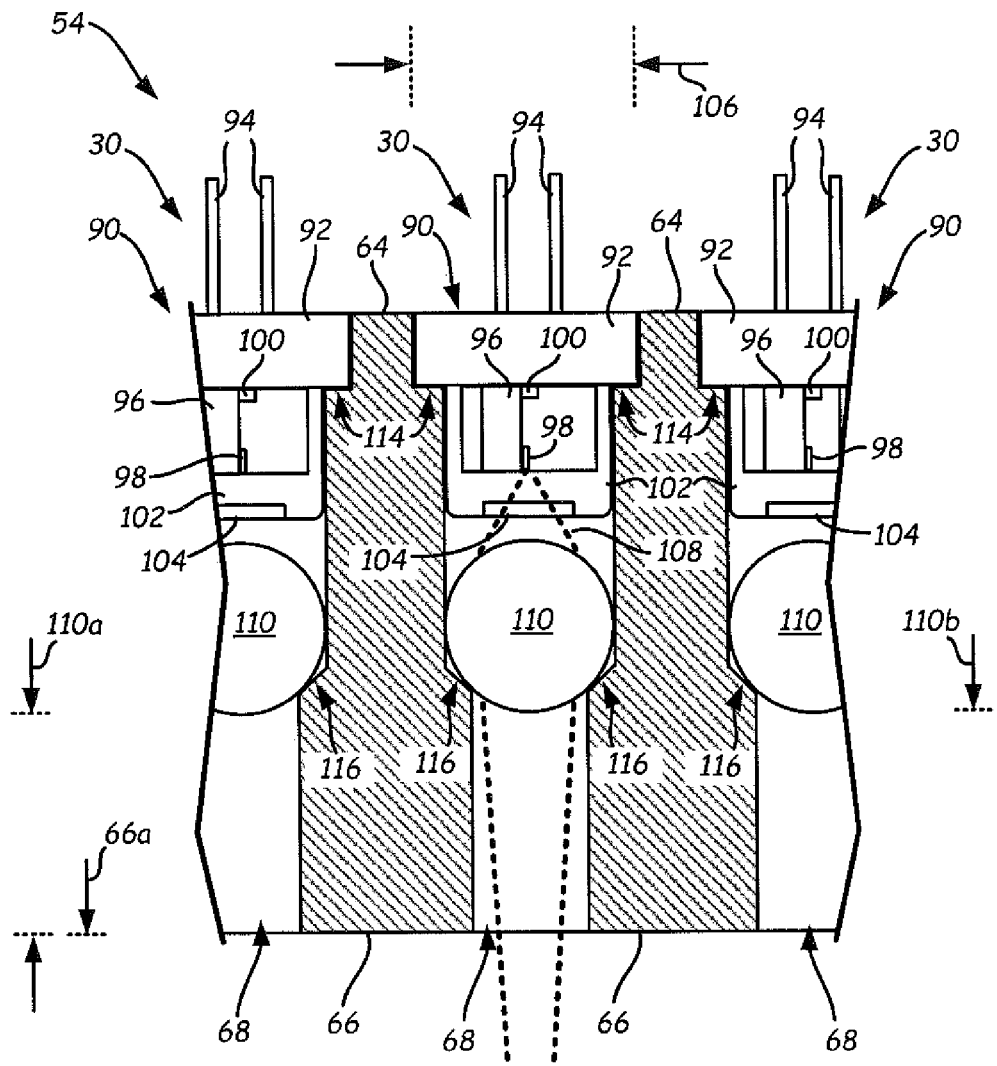
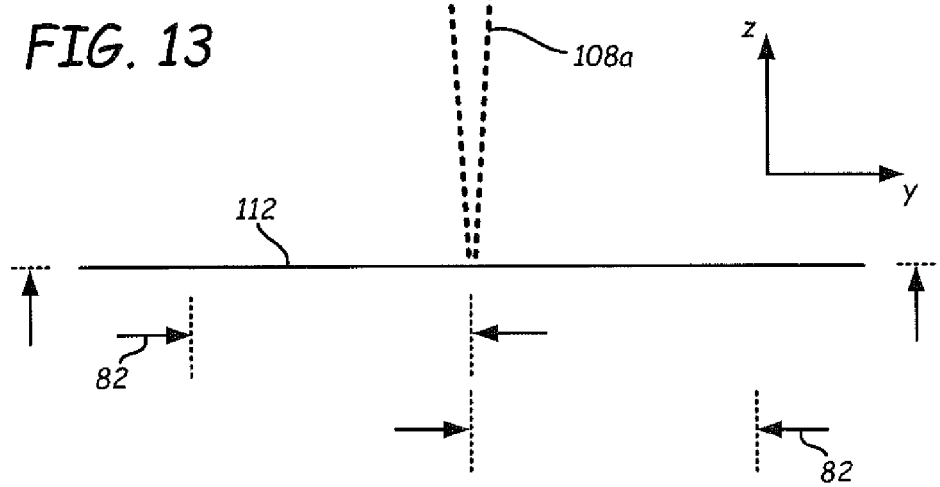
FIG. 13

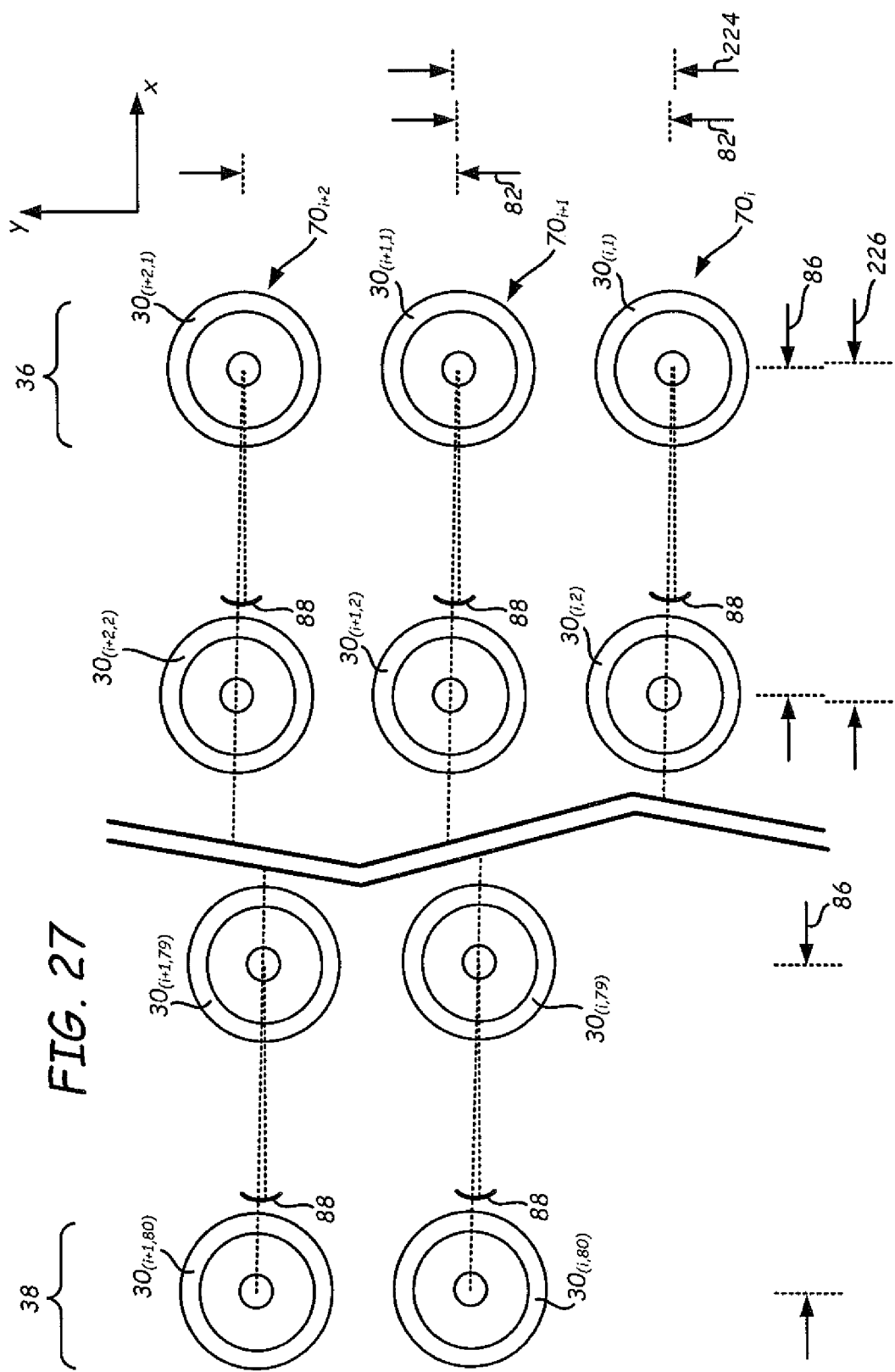

ADDITIVE MANUFACTURING SYSTEM WITH LASER ASSEMBLY

CROSS-REFERENCE TO RELATED APPLICATION

This Application is a Section 371 National Stage Application of International Application No. PCT/US2015/062388, filed Nov. 24, 2015 and published as WO/2016/085965 on Jun. 2, 2016, in English, which claims priority to the U.S. Provisional Patent Application No. 62/083,553, filed Nov. 24, 2014, the contents of which are hereby incorporated by reference in their entirety.

BACKGROUND

The present disclosure relates to additive manufacturing systems and processes for printing or otherwise building three-dimensional (3D) parts with layer-based, additive manufacturing techniques. In particular, the present disclosure relates to systems for printing 3D parts using optical-based additive manufacturing techniques.

Additive manufacturing systems are used to print or otherwise build 3D parts from digital representations of the 3D parts (e.g., STL format files) using one or more additive manufacturing techniques. Examples of commercially available additive manufacturing techniques include extrusion-based techniques, jetting, selective laser sintering, powder/binder jetting, electron-beam melting, digital light processing, and stereolithographic processes. For each of these techniques, the digital representation of the 3D part is initially sliced into multiple horizontal layers. For each sliced layer, a tool path or image is then generated, which provides instructions for the particular additive manufacturing system to print the given layer.

For example, in an extrusion-based additive manufacturing system, a 3D part may be printed from a digital representation of the 3D part in a layer-by-layer manner by extruding a flowable part material. The part material is extruded through an extrusion tip carried by a print head of the system, and is deposited as a sequence of roads on a substrate in an x-y plane. The extruded part material fuses to previously deposited part material, and solidifies upon a drop in temperature. The position of the print head relative to the substrate is then incremented along a z-axis (perpendicular to the x-y plane), and the process is then repeated to form a 3D part resembling the digital representation.

In another example, in a stereolithography-based additive manufacturing system, a 3D part may be printed from a digital representation of the 3D part in a layer-by-layer manner by tracing a laser beam across a vat of photocurable resin. For each layer, the laser beam draws a cross-section for the layer on the surface of the liquid resin, which cures and solidifies the drawn pattern. After the layer is completed, the system's platform is lowered by a single layer increment. A fresh portion of the resin may then recoat the previous layer, and the laser beam may draw across the fresh resin to pattern the next layer, which joins the previous layer. This process may then be repeated for each successive layer. Afterwards, the uncured resin may be cleaned, and the resulting 3D part may undergo subsequent curing.

In fabricating 3D parts by these techniques, supporting layers or structures are typically built underneath overhanging portions or in cavities of 3D parts under construction, which are not supported by the part material itself. A support structure may be built utilizing the same techniques by which the 3D part is formed. The host computer generates additional geometry acting as a support structure for the overhanging or free-space segments of the 3D part being formed. The support structure adheres to the 3D part during fabrication, and is removable from the completed 3D part when the printing process is complete.

SUMMARY

An aspect of the present disclosure is directed to a laser assembly for use with an additive manufacturing system. The laser assembly includes a base block that is configured to be moved along a first axis (e.g., a scan direction axis) in the additive manufacturing system. The laser assembly also includes a plurality of laser emitters arranged in arrays of two or more rows having two or more laser emitters that are optionally oriented at an oblique angle relative to the first axis. The laser assembly includes a controller assembly configured to control a movement of the base block along the first axis and to independently control at least timing and duration of energy emitted from each laser emitter of the plurality of laser emitters as the base block moves along the first axis. The laser assembly further includes at least a portion of a heat sink assembly that is configured to draw heat away from the base block.

Another aspect of the present disclosure is directed to a laser assembly for use with an additive manufacturing system, which includes a plurality of sub-blocks that are interconnected in a series of rows along a swath direction axis substantially normal to a scan direction axis and in a series of stacks along the scan direction axis. Each sub-block preferably includes a plurality of laser emitters, a fluid channel, and one or more portions configured to interconnect the sub-block to one or more adjacent sub-blocks in a manner such that the laser emitters of adjacent sub-blocks along series of stacks are arranged in arrays of two or more rows having two or more laser emitters that are optionally oriented at an oblique angle relative to the scan direction axis. The laser array also includes one or more manifolds operably connected to the fluid channel of each sub-block, and configured to circulate a heat-exchange liquid through and/or around each sub-block. The laser array may also optionally include one or more control boards connected to the plurality of laser emitters, and operably connected to a controller assembly of the additive manufacturing system. The controller assembly is configured independently control each laser emitter of the plurality of laser emitters to cause energy to be emitted for a selected duration based at least upon location of the laser emitter.

Another aspect of the present disclosure is directed an additive manufacturing system that includes a build platen configured to receive coatings or films of a photocurable resin, a platen gantry configured to move the build along a first axis, and a laser assembly. The laser assembly includes a base block includes a plurality of laser emitters secured to the base block arranged in an array of at least two rows of at least two laser emitter, where the laser emitters are optionally oriented at an oblique angle relative to a scan direction axis. The system also includes a laser gantry configured to move the laser assembly along the scan direction axis such that each of the plurality of laser emitters traverses across the build platen, and a heat sink assembly at least partially retained by the laser assembly, and configured to draw heat away from the base block and/or the laser emitters. The system further includes a controller assembly configured to operate the platform elevator, the laser assembly, and the gantry to print 3D parts on the platform in a layer-by-layer manner from the coatings or films of the photocurable resin.

Another aspect of the present disclosure is directed to a laser assembly for use with an additive manufacturing system, which includes a base block configured to be moved along a first axis in the system, and a plurality of laser emitters operably mounted to the base block and arranged in arrays of at least two rows where each row has at least two laser emitters, wherein each of the plurality of laser emitters are optionally oriented at an oblique angle relative to the first axis. The system also includes a coolant immersion casing configured to immerse the base block in a coolant liquid for drawing heat away from the laser emitters. The system further includes a controller assembly configured to operate the platform elevator, the laser assembly, and the gantry to print 3D parts on the platform in a layer-by-layer manner from the coatings or films of the photocurable resin.

Another aspect of the present disclosure is directed to a laser assembly for use with an additive manufacturing system for printing 3D parts from a powder-based material. The laser assembly includes a base block configured to be moved along a first axis in the additive manufacturing system, and a plurality of laser emitters operably mounted to the base block and arranged in array of at least two rows where each row has at least two laser emitters. Each of the laser emitters are optionally oriented at an oblique angle relative to the first axis, wherein each laser emitter is configured to generate an infrared-wavelength laser beam. The laser assembly also includes at least a portion of a heat sink assembly operably engaged with the base block, and configured to draw heat away from the laser emitters. The system further includes a controller assembly configured to operate the laser assembly to print 3D parts in a layer-by-layer manner.

Another aspect of the present disclosure is directed to an additive manufacturing system that includes a build platen configured to receive coatings or films of a material, a platen gantry configured to move the build platen along a first axis. The system includes a laser assembly that includes a base block and a plurality of laser emitters in at least a two by two laser emitter array. The system also includes a laser gantry configured to move the laser assembly at least along a scan length axis. The system includes a controller assembly configured to operate the platen gantry, the laser assembly, and the laser gantry to print three-dimensional parts on the platform in a layer-by-layer manner from the coatings or films of the material, based on a plurality of digital bitslices. The controller assembly is further configured to modify one or more of the digital bitslices to compensate for thermal expansions of the base block.

Other aspects of the present disclosure are directed to methods of operating the additive manufacturing systems and the laser assemblies, methods for fabricating the systems and laser assemblies, and to 3D parts printed from such systems and laser assemblies.

Definitions

Unless otherwise specified, the following terms as used herein have the meanings provided below:

Unless otherwise specified, temperatures referred to herein are based on atmospheric pressure (i.e. one atmosphere).

The term "additive manufacturing system" refers to a system that prints, builds, or otherwise produces 3D parts and/or support structures at least in part using an additive manufacturing technique. The additive manufacturing system may be a stand-alone unit, a sub-unit of a larger system or production line, and/or may include other non-additive manufacturing features, such as subtractive-manufacturing features, pick-and-place features, two-dimensional printing features, and the like.

The terms "command", "commanding", and the like, with reference to a controller assembly commanding a device (e.g., a laser emitter, a gantry, a motor, or the like), refers to the direct and/or indirect relaying of control signals from the controller assembly to the device such that the device operates in conformance with the relayed signals. The signals may be relayed in any suitable form, such as communication signals to a microprocessor on the device, applied electrical power to operate the device, and the like.

The term "providing", such as for "providing a device", when recited in the claims, is not intended to require any particular delivery or receipt of the provided item. Rather, the term "providing" is merely used to recite items that will be referred to in subsequent elements of the claim(s), for purposes of clarity and ease of readability.

The terms "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the present disclosure.

The terms "about" and "substantially" are used herein with respect to measurable values and ranges due to expected variations known to those skilled in the art (e.g., limitations and variabilities in measurements).

BRIEF DESCRIPTION OF THE DRAWINGS

FIG. 3 is a top view of the additive manufacturing system with laser assembly positioned on a second side of the system.

FIG. 4 is a side view of the additive manufacturing system shown in FIG. 3.

FIG. 5 is a top view of the additive manufacturing system, illustrating a 3D part being printed with the laser assembly.

FIG. 6 is a side view of the additive manufacturing system shown in FIG. 5.

FIG. 12 is a sectional view taken along an x-z plane, further illustrating the laser emitters.

FIG. 13 is a sectional view taken along a y-z plane, further illustrating the laser emitters.

FIG. 27 is a top illustration of arrays of laser emitters of the laser assembly, illustrating space-to-space offset changes from base block thermal expansions.

DETAILED DESCRIPTION

The present disclosure is directed to a system and process for printing 3D parts using an optical-based, additive manufacturing technique, which is capable of printing 3D parts at fast build rates, high resolutions, and in some embodiments, large build envelopes. The system includes a laser assembly and a resin vat (or tray), where the laser assembly includes multiple arrays of laser emitters that can be selectively and independently operated to crosslink a photocurable resin on a voxel-by-voxel basis as the laser assembly traverses across the resin vat. This produces a layer of the 3D part in conformance with a layer image or bitslice data. After each layer is formed, a platform in the resin vat is lowered (or raised, depending on the printing direction) to allow the next layer of resin to be applied. The process may then be repeated for each successive layer until the 3D part is completed.

Figure 1:
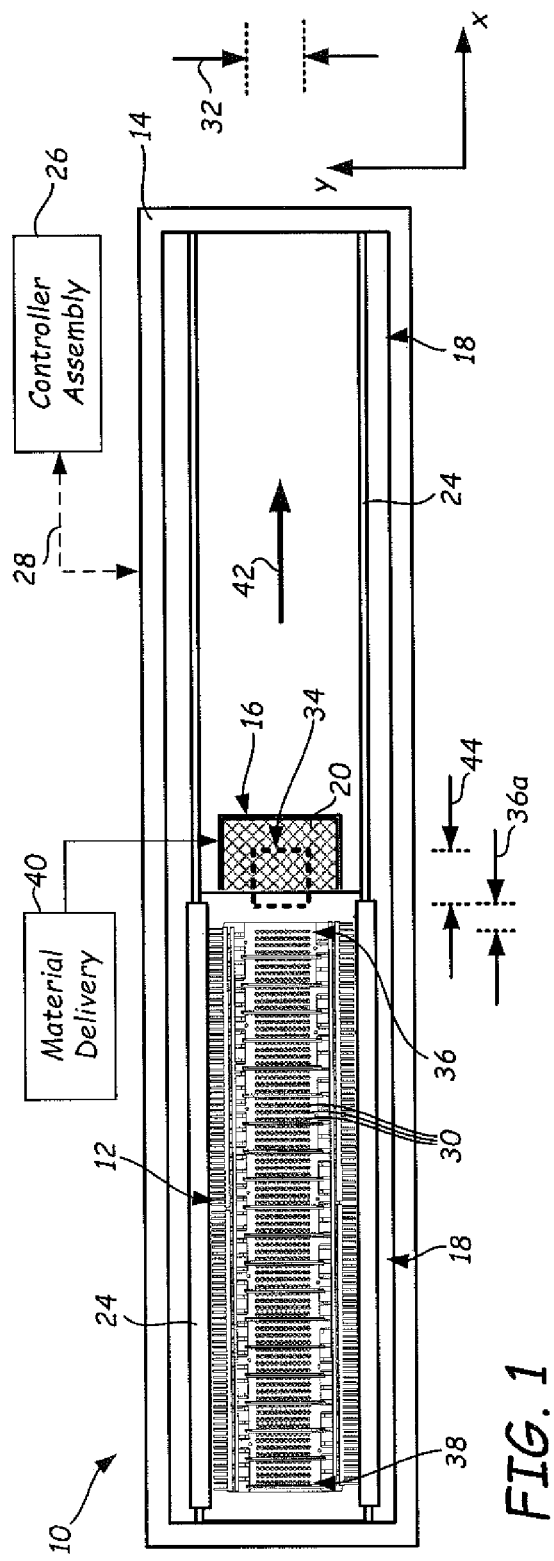
FIG. 1 is a top view of an additive manufacturing system having a laser assembly of the present disclosure positioned on a first side of the system.
Figure 2:
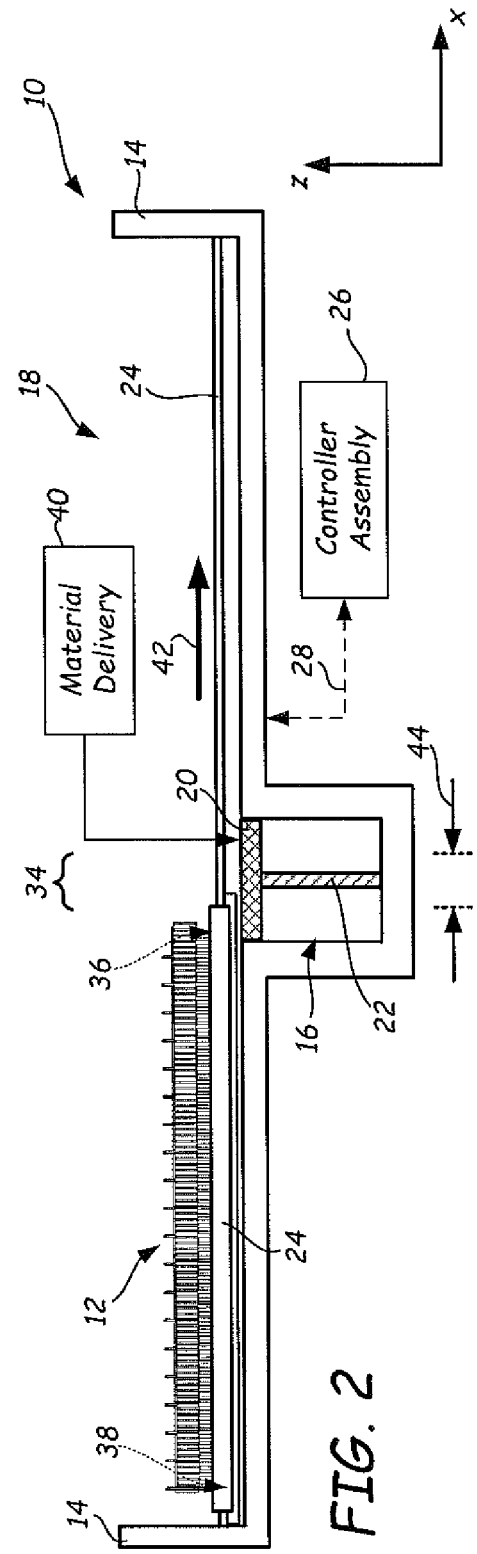
FIG. 2 is a side view of the additive manufacturing system shown in FIG. 1.

FIGS. 1 and 2 illustrate an exemplary system 10 that includes laser assembly 12 of the present disclosure in use to print 3D parts. In this example, system 10 also includes housing 14 having build vat 16 and an overhead region 18 generally defining a T-shape cross-sectional opening. Housing 14 can optionally include an enclosable lid or casing to enclose build vat 16 and overhead region 18 during operation.

The following initial discussion describes the components of the exemplary system 10, as shown in FIGS. 1 and 2, and how they operate with laser assembly 12. However, laser assembly 12 may alternatively be used with any suitable additive manufacturing system for printing 3D parts from photocurable resins. In some embodiments, laser assembly 12 may be inverted for use in an inverted printing orientation, where system 10 may print 3D parts upside down in a layer by layer manner.

In the shown embodiment, build vat 16 is a tank, tray, or other receptacle that is configured to retain a flowable photocurable resin used to print the 3D parts, and may have any suitable dimensions. System 10 also includes build platen 20 and platen gantry 22 (shown in FIG. 2), where build platen 20 is a receiving surface retained in build vat 16 for printing the 3D parts in a layer-by-layer manner, and may have a surface area up to the interior x-y dimensions of build vat 16.

Platen gantry 22 is an assembly configured to controllably move build platen 20 along (or substantially along) the vertical z-axis within build vat 16, such as in incremental steps a distance of a layer. This allows build platen 20 to be lowered incrementally to print each layer of a 3D part. Platen gantry 22 may operate to move build platen 20 with an actuator, such as but not limited to, one or more motors (e.g., stepper motors and encoded DC motors), gears, pulleys, belts, screws, linear bearings and rails, and the like.

Laser assembly 12 is mounted in overhead region 18, above build vat 16. Laser gantry 24 is configured to controllably move laser assembly 12 back-and-forth along the x-axis (scan direction axis) within overhead region 18. Laser gantry 24 may operate to move laser assembly 12 with one or more actuators, including but not limited to, motors (e.g., stepper motors and encoded DC motors), gears, pulleys, belts, screws, linear actuators, linear bearings and rails, and the like.

In some embodiments, laser gantry 24 also prevents or otherwise restricts laser assembly 12 from moving along the y-axis (swath direction axis) and/or the z-axis. However, in other embodiments, laser gantry 24 may controllably move laser assembly 12 along the y-axis, such as in small randomized offsets along the y-axis to overcome potential laser failures. In some embodiments the laser gantry 24 moves in a plane defined by the x-axis and the y-axis and allows a swath angle to be electronically programmed. In yet further alternative embodiments, laser gantry 24 may controllably move laser assembly 12 along the z-axis, if desired. Laser gantry 24 also preferably prevents laser assembly 12 from roll, pitch, and/or yaw movements relative to housing 14.

System 10 also includes controller assembly 26, which can include one or more computer-based systems and/or one or more control circuits configured to monitor and operate the components of system 10, such as laser assembly 12, motors for platen gantry 22, laser gantry 24, and various sensors, calibration devices, display devices, and/or user input devices. For example, one or more of the control functions performed by controller assembly 26 can be implemented in hardware, software, firmware, and the like, or combinations thereof.

Controller assembly 26 may communicate over communication line 28 with the various components of system 10, such as laser assembly 12, motors for platen gantry 22, laser gantry 24, and various sensors, calibration devices, display devices, and/or user input devices. While communication line 28 is illustrated as a single signal line, it may include one or more electrical, optical, and/or wireless signal lines and intermediate control circuits, allowing controller assembly 26 to communicate with various components of system 10.

Figure 7:
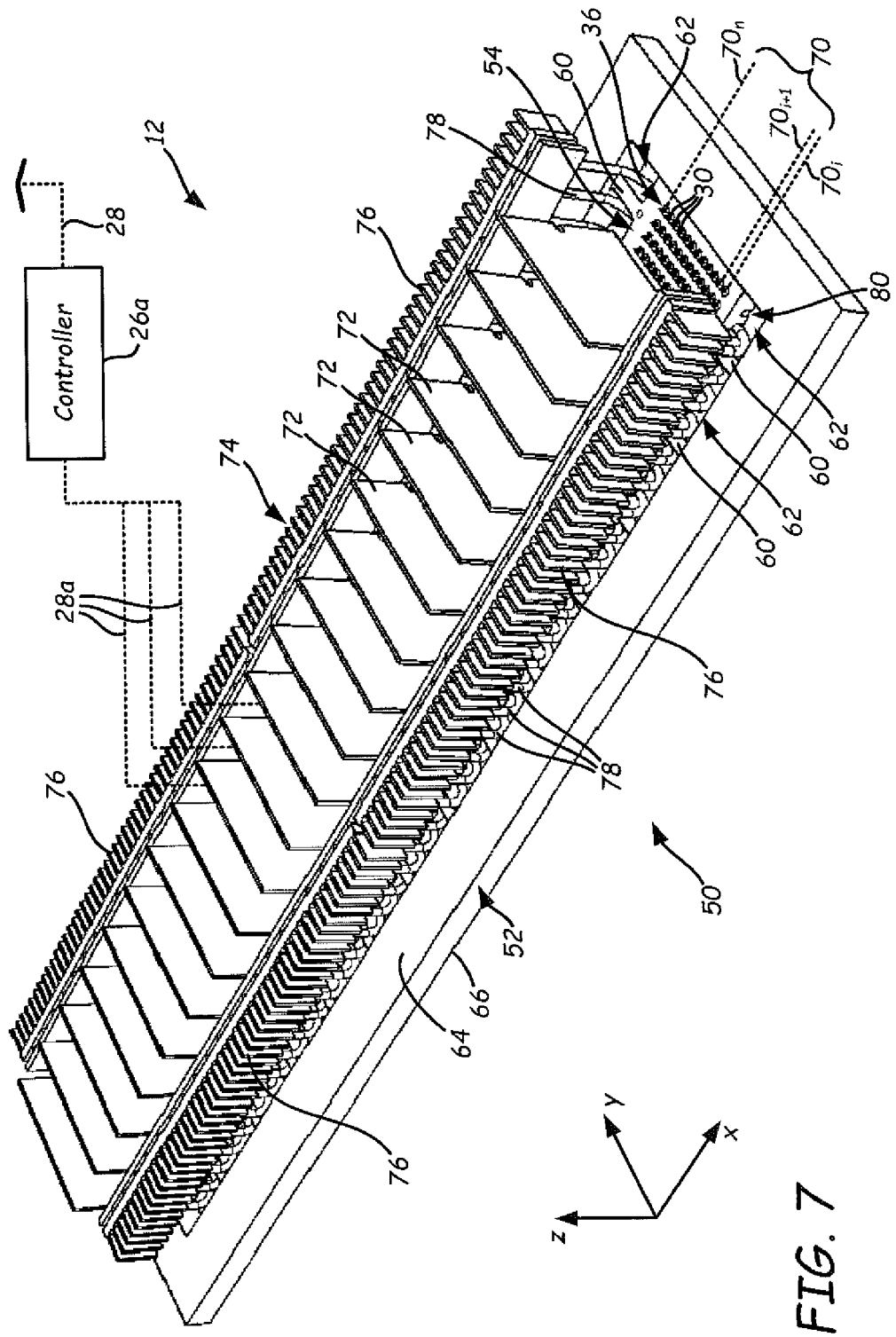
FIG. 7 is a top front perspective view of the laser assembly.

Controller assembly 26 may also include one or more computer-based systems having computer-based hardware, such as data storage devices, processors, memory modules and the like for generating, storing, and transmitting tool path and related printing instructions to system 10 (e.g., to system controller 26b illustrated in FIG. 7). Furthermore, one or more portions of controller assembly 26 may be retained by laser assembly 12. For instance, controller assembly 26 may include one or more intermediate controllers mounted to laser assembly 12, which may relay data (e.g., compressed image data and timing information) to additional control boards (e.g., laser driver boards) of laser assembly 12.

Laser assembly 12 is an exemplary laser array assembly of the present disclosure, and includes multiple arrays of laser emitters 30 (best shown below in FIGS. 7-14) that can be selectively and independently operated to emit laser beams on a voxel-by-voxel basis. The arrays are each preferably oriented at an oblique angle relative the x-axis, thereby creating a saber angle effect for the retained laser emitters 30. For example, the multiple arrays of laser emitters 30 may be mounted in interior frame 54 at the oblique angle. Alternatively, the multiple arrays of laser emitters 30 may be rectilinear relative to interior frame 54, and laser assembly 12 itself may be mounted to gantry 24 at an oblique angle relative the x-axis to achieve the same saber angle effect. In either embodiment, the angled arrangement of laser emitters 30 allows laser assembly 12 to effectively increase the voxel printing resolution for selectively cross-linking the resin film in a predefined pattern to form a layer of a 3D part.

As can be seen in FIG. 1, the arrays of laser emitters 30 (referred to as arrays 70, shown below in FIGS. 7-11) are separated along the y-axis to define a swath width 32. Swath width 32 can define the maximum y-axis limits for a build envelope in which a 3D part may be printed, referred to as build envelope 34. As discussed below, swath width 32 can be any reasonably desired distance, and preferably does not directly affect the printing speeds for system 10.

Laser emitters 30 may also be arranged in a series of y-axis rows that include a leading row 36 and a trailing row 38, and which are spaced apart along the x-axis. The terms "leading" and "trailing" are used for convenience, and are not intended to limit the use of laser assembly 12. As will be discussed below, gantry 24 is configured to controllably move laser assembly 12 in back-and-forth directions along the x-axis for printing layers. With laser assembly 12 at the left-side set position in overhead region 18, as shown in FIGS. 1 and 2, the leading row 36 of laser emitters 30 is located to the left side of build envelope 34 by a distance 36a (shown in FIG. 1), which accounts for accelerations and decelerations of laser assembly 12.

During the printing operation, controller assembly 26 may command platen gantry 22 to move build platen 20 to a predetermined height within build vat 16. A flowable film of the photocurable resin may also be applied to the top surface of build platen 20 using any suitable mechanism. For instance, build vat 16 may function as a reservoir of the resin, where build platen 20 is lowered into the resin until a film corresponding to a single-layer increment flows across its top surface.

Alternatively, each resin film may be supplied from one or more material delivery devices (e.g., material delivery device 40), such as a pressurized flow of the resin and/or a web-carried resin. Controller assembly 26 may also monitor and operate material delivery device 40 over communication line 28. In some preferred embodiments, system 10 may include two material delivery devices 40, each one mounted on the leading and trailing ends of laser assembly 12 for bidirectional printing. In these embodiments, controller assembly 26 may command material delivery devices 40 to deposit the resin to form the resin film after (and/or before) laser assembly 12 traverses across platform 20.

Once the resin film for the current layer is applied and level, controller assembly 26 may then command laser gantry 24 to move laser assembly 12 along the x-axis in the direction of arrow 42 to traverse across the film of resin on platform 18. While moving along the x-axis, laser emitters 30 are selectively and independently operated to emit laser beams on a voxel-by-voxel basis within build envelope 34 wherein controller assembly 26 controls timing, duration and optionally intensity of the emitted laser beams independently for each laser emitter 30. This selectively crosslinks the resin film in a predefined voxel pattern to form a layer of the 3D part.

As shown in FIGS. 3 and 4, this process may continue until laser assembly 12 reaches the opposing, right-side, set position of overhead region 18. With laser assembly 12 at this right-side set position, the trailing row 38 of laser emitters 30 are located on the right side of build envelope 34 by a distance 38a (shown in FIG. 3), which also accounts for accelerations and decelerations of laser assembly 12.

Accordingly, the x-axis limits for build envelope 34 correspond to scan length 44, which is the distance over which each laser emitter 30 in laser assembly 12 passes across at a substantially steady rate of movement. As such, laser assembly 12 preferably moves in the direction of arrow 42 to traverse distance 36a (shown in FIG. 1) for acceleration, scan length 44 for printing at a substantially steady rate of movement, and distance 38a (shown in FIG. 3) for deceleration. In other words, the cross-sectional area of build envelope 34 in which a 3D part may be printed can be defined by swath width 32 and scan length 44.

Once laser assembly 12 reaches the right-side set position, controller assembly 26 may command platen gantry 22 to move build platform 20 downward by a single layer increment within build vat 16. The next resin film may then be applied to the top surface of the recently-printed layer. Once this resin film is applied and level, controller assembly 26 may command gantry 24 to move laser assembly 12 back along the x-axis in the direction of arrow 46 to traverse across the resin film. While moving along the x-axis, laser emitters 30 may again be selectively and independently operated to emit laser beams on a voxel-by-voxel basis within build envelope 34 wherein control assembly 26 controls timing, duration and optionally intensity of the emitted laser beams. This selectively crosslinks the resin film in a predefined voxel pattern to form the next layer of the 3D part, which bonds to the previously-formed layer.

In some embodiments, the film of resin is applied from the leading edge of the laser assembly 12 as the laser assembly 12 is moving. As such, there is no delay relative to an asynchronous coating step followed by a curing step. However, a coating step followed by a curing step is within the scope of the present disclosure.

In the event that a dwell time for leveling the film is required, the film can be applied from a trailing edge of the laser assembly 12 and then cured as the laser assembly returns over the applied layer. It is contemplated that the disclosure could utilize bi-directional printing where two recoaters are located on both ends of the laser assembly.

The present disclosure can be utilized with a single material to form the part. Alternatively, different materials can be utilized when the resin is applied over the previously printed layer, which allows different physical and/or mechanical properties in the part being built relative to a part printed from a single material.

As shown in FIGS. 5 and 6, this back-and-forth process may be repeated for each layer until the 3D part (referred to as 3D part 48) is completed. Afterwards, 3D part 48 may be removed from system 10 and undergo one or more post-processing steps, such as resin removal and/or post-curing steps.

In another embodiment, the laser assembly 12 can be rotated about an axis of rotation relative to the part being built or the part being built can be rotated relative to the laser assembly 12. When the laser assembly and the part are rotated relative to each other, a cylindrical coordinate system can be utilized wherein the above disclosed x-axis is replaced with r,θ and can be of an arbitrary length.

Figure 8:
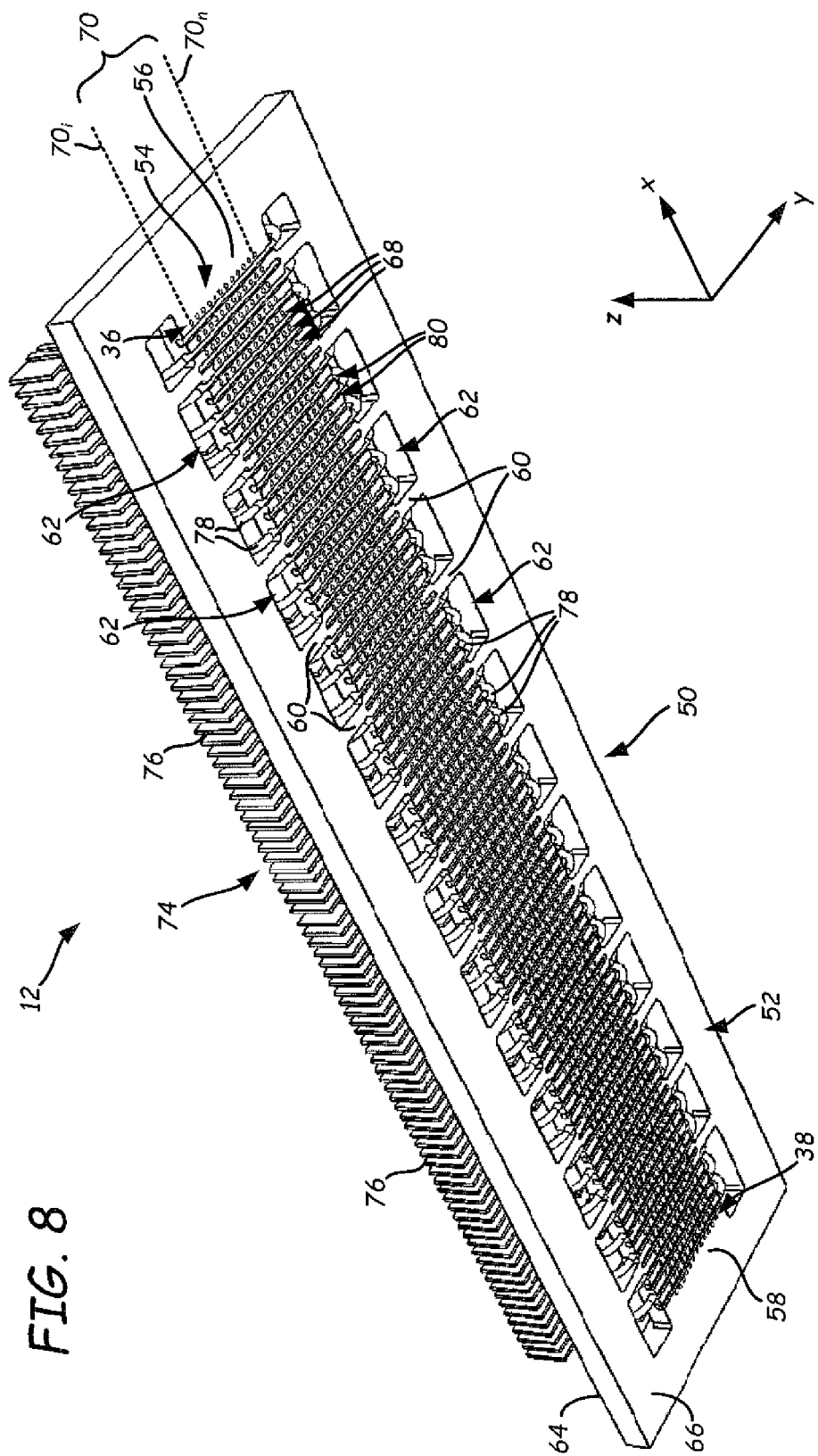
FIG. 8 is a bottom front perspective view of the laser assembly.

FIGS. 7-10 further illustrate an exemplary embodiment of laser assembly 12. As shown in FIGS. 7 and 8, laser assembly 12 includes a base block 50, which is preferably fabricated (e.g., machined) from one or more thermally-conductive materials. Suitable materials for base block 50 include highly thermally conductive metallic materials, such as aluminum or copper. In the shown example, base block 50 includes an outer perimeter frame portion 52 and interior frame portion 54, which are preferably integrally machined from a single feedstock, or otherwise stated of a monolithic construction. However, in alternative embodiments, perimeter frame portion 52 and interior frame portion 54 may be separately machined and secured together.

Perimeter frame portion 52 is suitable for mounting laser assembly 12 to gantry 24 in any suitable manner In the laser assembly 12, perimeter frame portion 52 has a rectangular geometry, where interior frame portion 54 extends inwardly from inner sides of perimeter frame 52. In particular, interior frame portion 54 is connected to perimeter frame portion 52 with end extensions 56 and 58 (shown in FIG. 8) and multiple laterally-extending ribs 60. In this arrangement, the laterally-extending ribs 60 are separated from each other by gaps 62 (best shown in FIG. 8).

This arrangement reinforces the connections between perimeter frame portion 52 and interior frame portion 54, thereby providing a stiff engagement that prevents interior frame portion 54 from moving (e.g., shifting) relative to perimeter frame portion 52 during the back-and-forth movement along the x-axis. To ensure good printing resolutions, in preferred embodiments, base block 50 is dimensionally rigid such that sag and vibrations are less than 50 micrometers root-mean-square along the x-axis and/or the y-axis. However, this measure of rigidity is not limiting. This arrangement can also improve the flow of heat that is generated by laser emitters 30, and direct the heat emissions away from build vat 16.

Base block 50 also includes a top surface 64 and a bottom surface 66, of both perimeter frame portion 52 and interior frame portion 54. The terms "top" and "bottom" are used for convenience of discussion, and are not intended to limit the orientation of laser assembly 12. For instance, laser assembly 12 may be inverted for use in an inverted printing design. Accordingly, bottom surface 66 is the side that faces the resin film and build platform 20, and top surface 64 is the opposing major surface from bottom surface 66.

Interior frame portion 54 includes multiple channels 68 for receiving the laser emitters 30, where channels 68 may be machined through interior frame portion 54 (through top surface 64 and bottom surface 66). The locations of channels 68 in the x-y plane preferably arrange laser emitters 30 in multiple arrays 70, which are individually referred to as arrays $70_i, 70_{i+1}, \ldots, 70_n$, and where "n" is the total number of arrays 70. In the shown example, laser assembly 12 includes twelve arrays 70 of laser emitters 30, which are separated from each other along the y-axis. However, the present disclosure can be utilized with an array of two or more rows where each row includes two or more laser emitters. As discussed below, each array 70 preferably extends at a small oblique angle relative to the x-axis to compensate for differences between laser packing densities and printing resolutions. A typical range of the oblique angle is between about 5° and about 85°. The small oblique angle for each array 70 may be achieved, for example, by machining channel 68s through interior frame portion 54 in a pattern that defines the oblique angle. Alternatively, channels 68 may be rectilinear relative to interior frame portion 54, and laser assembly 12 itself may be mounted to gantry 24 at an oblique angle relative the x-axis to achieve the same saber angle effect. What is meant by a saber angle effect is orientation of the lasers such that the beams emitted can span the entire area of the array 70 without interruption.

By way of example, assuming a line of laser emitters are spaced apart by a distance D and each laser emitter has a beam diameter of d. If d<D, then scanning this array in a direction perpendicular to the line will leave a gap of (D−d) between the footprint of each laser beam having a diameter d. To remove the gap, the laser emitters are located at an angle from perpendicular to the scan direction by a cos(d/D).

The facets on a side-emitting solid state laser tend to be elongated in the plane of the laser chip. To minimize the required saber angle, the normal direction of each chip should point in the scan direction. However, in many instances this is not practical. For instance, if the laser emitter face has a rectangular configuration with dimensions of d1×d2, where d1>>d2, and all of the faces d1 are substantially collinear within a row, then the sable angle can be calculated as a tan((D−d1)/d2).

However, in some instances, full coverage across a row of laser emitters in an array 70 is not feasible. Therefore, having multiple rows in an array 70 at an oblique angle allows for full coverage across the array 70, and more fine detail in the printed parts.

In some instances to provide the necessary coverage across the array 70, the direction of travel of the array 70 can be rotated slightly from an axis, such as the x-axis as described above such that the array 70 moves in both the x direction and slightly in the y direction. Moving the array 70 in both the x direction and the y direction effective produces the above mentioned saber angle without requiring mechanical adjustment.

Laser assembly 12 also preferably includes one or more laser control boards 72, which may function as laser driver boards that communicate with controller assembly 26 over communication line(s) 28. For example, as mentioned above, controller assembly 26 may include one or more intermediate controllers mounted to laser assembly 12, such as controller 26a (shown in FIG. 7). Controller 26a may accordingly connect to each laser control board 72 over one or more high-speed data lines 28a.

In some instances, an intensity of each laser emitter in the array 70 is measured to account for variability in the intensities. The variations in intensity of each diode, whether due to differences in the diode, lens or decay with use can be accounted for so that the final output exposures are substantially the same across the array 70. Otherwise stated, the exposure outputs are leveled to an acceptable range. By way of example, if the brightest laser emitter emits a 50 mW beam and the dimmest laser emitter emits a 30 mW beam, then the dimmer laser emitter must be exposed longer or the brighter laser emitter essentially must be dimmed.

For instance, optical feedback control can be utilized to regulate or control the drive current to an individual laser emitter to control the output power to be within a margin of error of a setpoint. Optical sensors can be positioned proximate a facet, such as a back facet on the laser substrate. Alternatively, a sensor, such as a line scan camera can be utilized to monitor beam intensity of the individual laser emitters, where the sensed intensity can be used to control the current to an individual laser such that the energy output is within a margin of error of a setpoint.

Another option is to utilize a photodiode having a length that spans the width of the array of laser emitters that is located at a position such that every laser emitter passes over the diode during a scan. Any particular laser emitter can be energized to sense the intensity of the emitted beam to provide data to control the current to the laser emitter to match the set point. In some embodiments the laser emitters can be calibrated in a round robin polling routine to allow the control assembly to use feed back control to control the intensity of each of the laser emitters. The present disclosure is not limited to regulating drive current, but rather other variables that can be regulated include, but are not limited to temperature, duration of time that the laser is emitting a laser beam, downstream attenuators and combinations thereof.

In some embodiments, the laser array can have a digital to analog converter (DAC) for each laser emitter in the array and a look up table generated by a calibration routine, such as mentioned above. When a voxel is to be written, the DAC is loaded with a value from the look up table corresponding to the desired dose of energy for that particular voxel. The use of a DAC and a look up table can be useful in providing anti-aliasing effects, such as varying the effective laser beam spot size and depth with sub-voxel resolution.

Alternatively, the laser emitters can be driven using pulse width modulation (PWM) on the on-state of the individual laser emitters to achieve the desired average power. PWM can be more power efficient, but requires high speed switching circuits to have many PWM cycles within each voxel. In some embodiments the controller assembly can set a turn-on time from a start of a voxel to the rising edge of laser power, and the controller assembly can set the turn-off time from the from the falling edge of the laser power to the transition to the start of the next voxel in the scan.

In this exemplary embodiment, controller assembly 26 may relay data (e.g., compressed image data and timing information) and electrical power to controller 26a over communication line 28, and controller 26a may then disseminate the data and electrical power to laser control boards 72 over data lines 28a. As such, based on commands from controller assembly 26 and/or 26a, laser control boards 72 can selectively and independently operate each laser emitter 30 including but not limited to, timing based on emitter location relative to part being printed, duration and optionally intensity. In the illustrated embodiment, laser assembly 12 includes twenty laser control boards 72, each of which is associated with a set of laser emitters 30, and each of which may communicate with controller assembly 26 over communication line(s) 28 (e.g., with controller 26a and data lines 28a) to provide a suitable data bandwidth. Alternatively, laser assembly can include any suitable number of laser control boards 72 (e.g., one or more laser control boards 72) and the present disclosure is not limited to any particular laser control boards 72 or laser emitter 30.

Laser assembly 12 also preferably includes a heat sink assembly 74 to draw away heat that is generated by the array of laser emitters 30 during operation. By way of example, laser emitters 30 configured to emit ultraviolet-wavelength light typically have about 10% power efficiencies. As such, for laser emitters 30 with average laser power outputs of about 50 milliwatts, the amount of energy released as heat can reach up to about 0.5 watts per laser emitter 30. As can be appreciated, as the number of laser emitters 30 increases, the amount of heat generated can readily increase above acceptable temperatures.

It has been found that, during operation, the average temperature increase for laser assembly 12 should not exceed about 25° C. above room temperature (e.g., less than about 50° C.). More preferably the average temperature increase for laser assembly 12 should not exceed about 20° C. above room temperature (e.g., less than about 45° C.). In some embodiments, the average temperature increase for laser assembly 12 should not exceed about 10° C. above room temperature (e.g., less than about 35° C.). This preserves the operating lives of laser emitters 30, and can prevent excess heat from potentially radiating to the underlying resin in vat 16.

Figure 10:
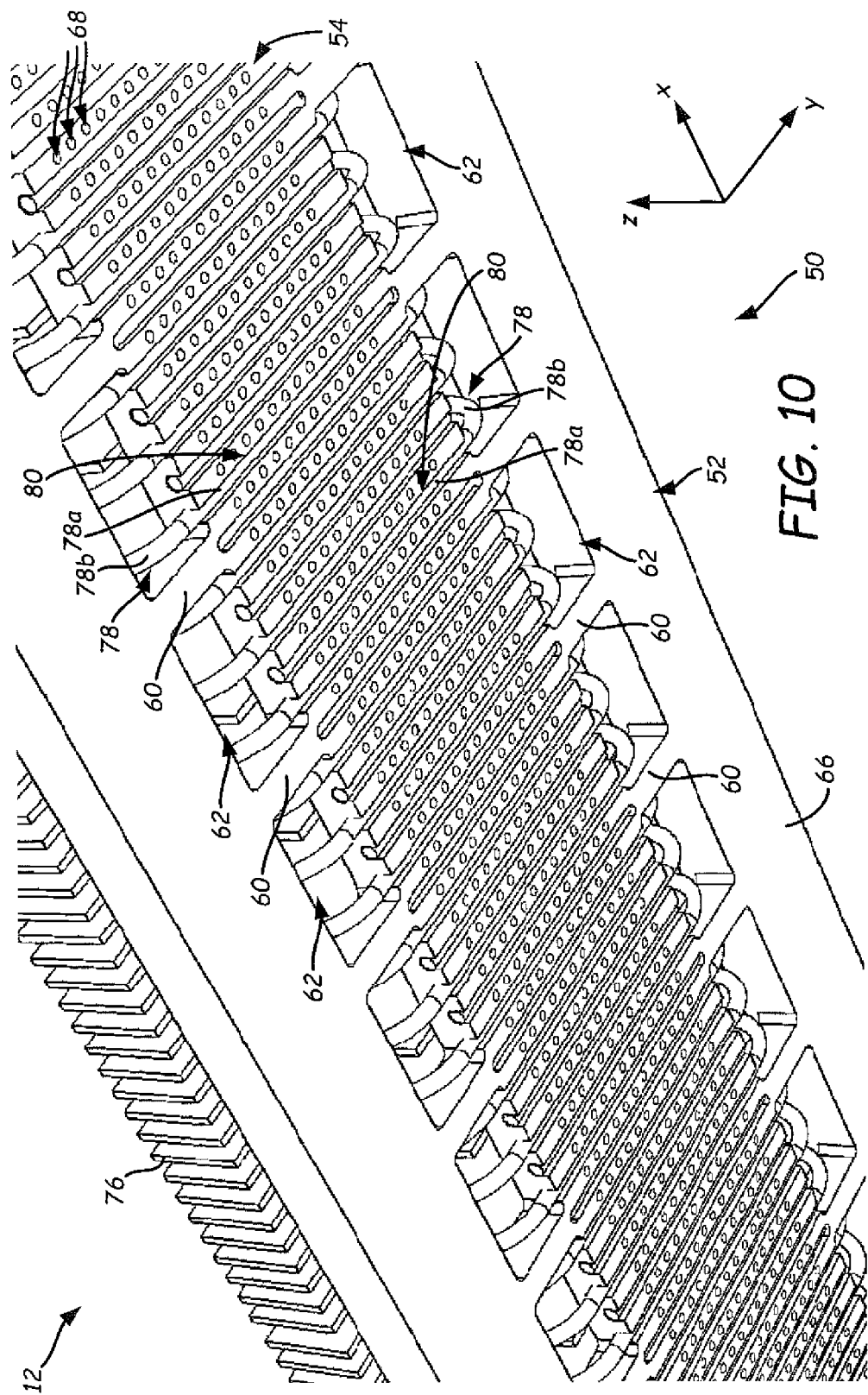
FIG. 10 is an enlarged view of a portion of the laser assembly as shown in FIG. 8.

In the shown example, heat sink assembly 74 includes one or more elongated heat fins 76 extending along the x-axis, and a plurality of heat pipes 78 extending between heat fins 76 and interior frame 54 of base block 50. As shown in FIGS. 8 and 10, interior frame 54 may also include multiple slots 80, each slot 80 extending substantially along the y-axis and bisecting a distance between adjacent laser emitters 30 along the x-axis. In this shown example, each slot 80 is machined as an inverted U-shaped channel extending from bottom surface 66 and into the interior frame portion 54. Alternatively, each slot 80 can be machined as bores in interior frame portion 54 between bottom surface 66 and top surface 64.

Figure 9:
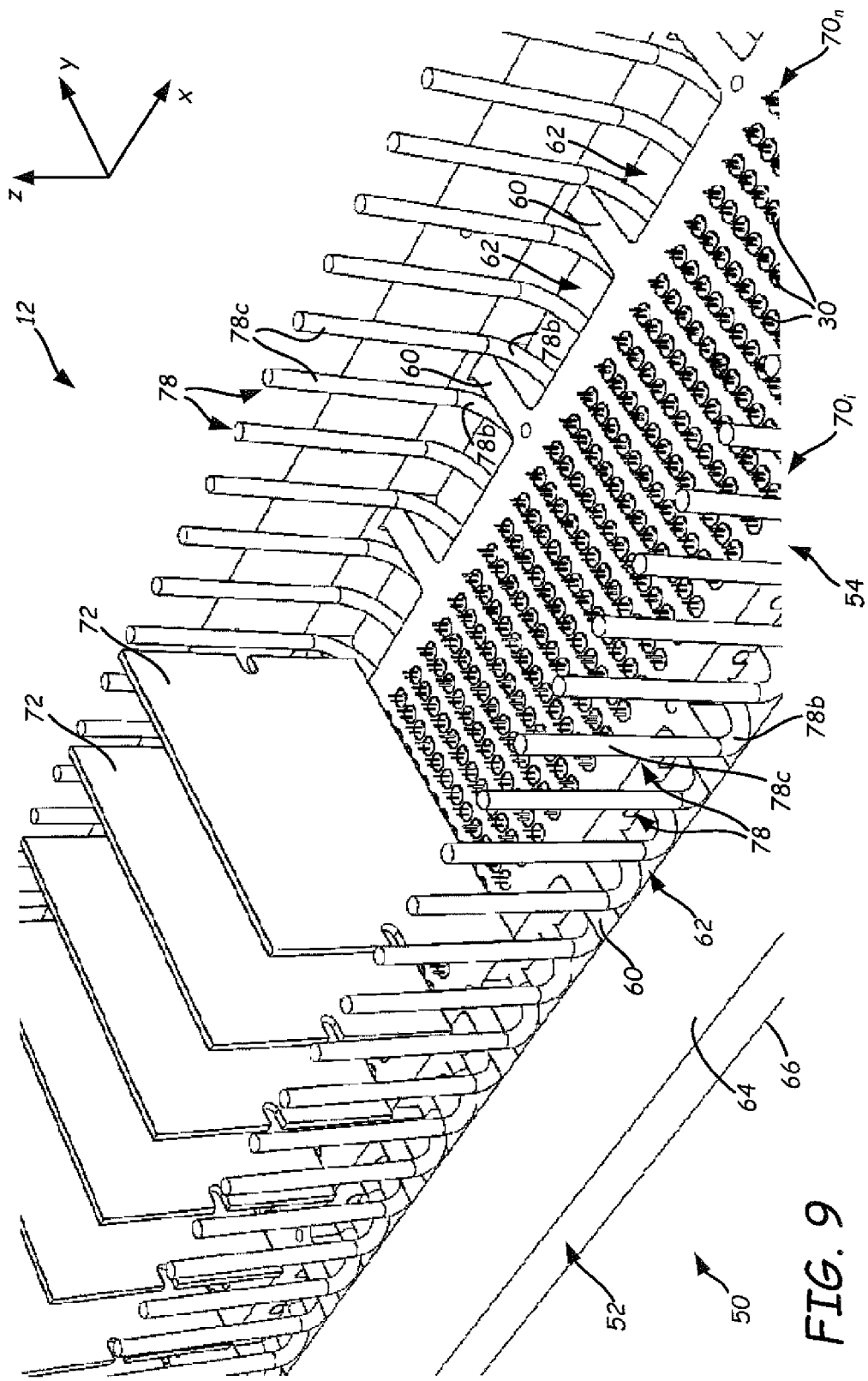
FIG. 9 is an enlarged view of a portion of the laser assembly as shown in FIG. 7, where a portion of control boards and heat fins are omitted.

As shown in FIGS. 9 and 10, each heat pipe 78 has an L-shaped geometry having an hot interface segment 78a, an intermediate segment 78b, and a cold interface segment 78c, where intermediate segment 78b connects interface segments 78a and 78c. Each hot interface segment 78a extends into one of the slots 80, preferably with sufficient contact to maximize conductive heat transfer from interior frame portion 54 to heat pipes 78. In some embodiments, hot interface segments 78a of heat pipes 78 may be adhered to interior frame portion 54 within slots 80 with a thermally-conductive adhesive that can increase the thermal transfer from the interior frame portion 54 to the heat pipes 78.

Intermediate segments 78b of heat pipes 78 bend upward through gaps 62 (between ribs 60) and continue into cold interface segments 78c. Cold interface segments 78c are secured to heat fins 76, preferably with sufficient contact to maximize conductive heat transfer from heat pipes 78 to heat fins 76. During operation, laser emitters 30 can generate a significant amount of heat, which is transferred to interior frame portion 54. For instance, laser emitters 30 can produce six kilowatts of heat per square meter. Heat pipes 78 accordingly draw a significant portion of this heat away from interior frame portion 54 to heat fins 76, where heat can be dissipated, such as with one or more fans (not shown). Heat pipes 78 have an internal bore extending through the segments 78a, 78b, and 78c. Heat pipes 78 include a mesh material along the internal bore that retains a liquid that vaporizes in hot interface segment 78a and sufficiently cools in the cold interface segment 78c, such that the liquid condenses forms in reflux which is subsequently revaporized when it reaches the hot interface segment 78a. The removal of the heat utilizing the latent heat of vaporization in an effective and efficient process to remove heat from the interior frame portion 54.

Additionally, the shown arrangement for laser assembly 12, where heat pipes 78 extend upward through gaps 62 to engage with heat fins 76 on the top side of base block 50 (i.e., on the side of top surface 64), dissipates the heat at a location that is remote from build vat 16 and platform 20. Moreover, perimeter frame portion 52 is preferably positioned below heat fins 76 to assist in shielding build vat 16 from the heat dissipated from heat fins 76.

While illustrated with heat fins 76 and heat pipes 78, heat sink assembly 74 may alternatively include any suitable heat removal architecture for removing heat from laser assembly 12. In some embodiments, heat sink assembly 74 may incorporate liquid cooling, such as a liquid-water-based cooling architecture. For example, heat fins 76 may be omitted, and each L-shaped heat pipe 78 may be replaced with a U-shaped water conduit (not shown) extending through each channel 80 with inlet and outlet ends extending upward to operably connect to a liquid circulator and heat exchanger (not shown).

As mentioned above, laser emitters 30 are arranged in multiple arrays 70. The number of adjacent arrays 70 along the y-axis may depend on the desired swath width 32 to be printed and the achievable packing density of laser emitters 30. Swath width 32 may be selected as any suitable length required to provide a desired build envelope 34 along the y-axis, subject to the heat removal limitations of heat sink assembly 74.

The packing density of laser emitters 30 can affect the printing resolution, where higher packing densities will position the laser emitters 30 of adjacent rows of arrays 70 closer together along the y-axis produce higher printing resolutions. However, the packing densities of laser emitters 30 are restricted by a combination of the dimensions of each laser emitter 30 and the heat transfer capabilities of base block 50 and heat sink assembly 74.

Standard laser chips are typically packaged with sizable protective casings, thermal spreaders, and substrate mounts, which can range from about 3.0 to about 3.5 millimeters in diameter, for example. This can effectively limit the packing density of laser emitters 30 to center-to-center offsets of about 4.0 millimeters or more along the y-axis. As can be appreciated, this packing density itself is not sufficient for high resolution printing, such as voxel resolutions as low as about 50 micrometers, about 25 micrometers, or even smaller.

Figure 11:
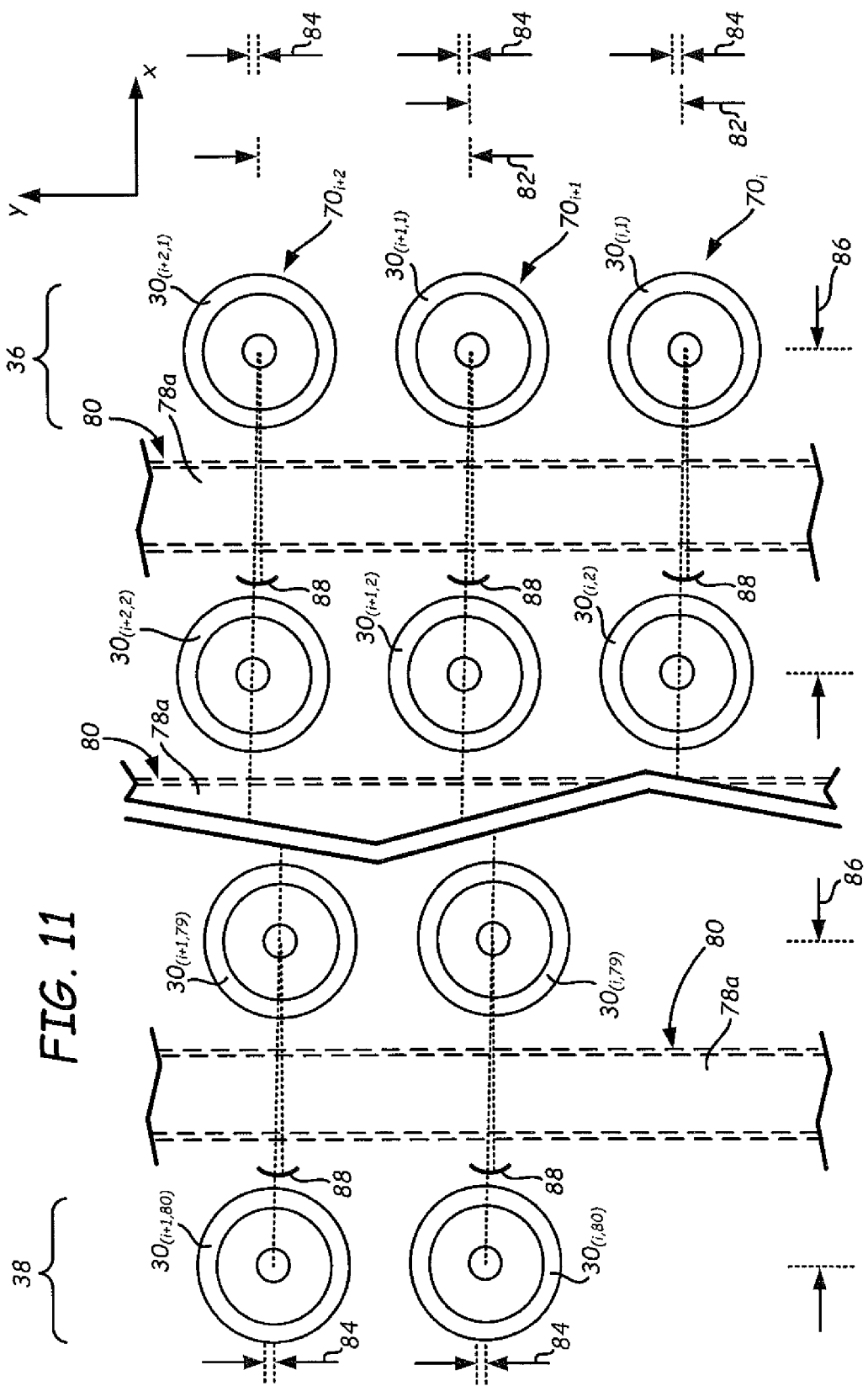
FIG. 11 is a top illustration of arrays of laser emitters of the laser assembly.

As such, each array 70 preferably includes rows having multiple laser emitters 30 that extend at an oblique angle relative to the x-axis, where the number of laser emitters 30 in each row of the array 70 preferably compensates for the difference between the laser packing density and the printing resolution. By way of non-limiting example, as illustrated in FIG. 11, assuming a center-to-center, array offset 82 along the y-axis between laser emitters 30 of adjacent arrays 70 (e.g., between a first array $70_i$ and a second array $70_{i+1}$) of about 4.0 millimeters, and a voxel printing resolution of about 50 micrometers, each row of array 70 will require eighty laser emitters 30. These laser emitters 30 will have center-to-center diode offsets 84 along the y-axis of about 50 micrometers, which is the same as the voxel printing resolution.

Laser emitters 30 in each array 70 may also have center-to-center row offsets 86 along the x-axis. As shown, x-axis row offsets 86 are longer than y-axis array offsets 82. This is to account for the cross-sectional dimensions of the hot interface segments 78a of heat pipes 78 and channels 80.

In a first example, arrays $70_i$, $70_{i+1}$, and $70_{i+2}$ may each include rows of eighty laser emitters 30, where the laser emitters 30 for array $70_i$ are referred to as laser emitters $30_{(i,1)}, 30_{(i,2)}, \ldots 30_{(i,80)}$. Similarly, the laser emitters 30 for array $70_{i+1}$ are referred to as laser emitters $30_{(i+1,1)}, 30_{(i+1,2)}, \ldots, 30_{(i+1,80)}$, and the laser emitters 30 for array $70_{i+2}$ are referred to as laser emitters $30_{(i+2,1)}, 30_{(i+2,2)}, \ldots, 30_{(i+2,80)}$. The first laser emitters 30 in each array 70 (e.g., laser emitters $30_{(i,1)}, 30_{(i+1,1)}, 30_{(i+2,1)}, \ldots, 30_{(n,1)}$) are arranged along the y-axis as the leading row 36, as discussed above. Correspondingly, the last laser emitters 30 in each array 70 (i.e., laser emitters $30_{(i,80)}, 30_{(i+1,80)}, 30_{(i+2,80)}, \ldots, 30_{(n,80)}$) are arranged along the y-axis as the trailing row 38, as also discussed above.

FIG. 11 also illustrates the small oblique angles for the arrays 70 of laser emitters 30 in an exaggerated manner. For instance, laser emitters $30_{(i,1)}, 30_{(i,2)}, \ldots, 30_{(i,80)}$ of array $70_i$ are oriented at angle 88 relative to the x-axis. This positions the last laser emitter $30_{(i,80)}$ of array $70_i$ at about the same y-axis diode offset 84 from the first laser emitter $30_{(i+1,1)}$ of the adjacent array $70_{i+1}$. As such, orienting laser emitters $30_{(i,1)}, 30_{(i,2)}, \ldots 30_{(i,80)}$ of array $70_i$ at angle 88 effectively compensates for the difference between the y-axis array offset 82 between laser emitters 30 of adjacent arrays $70_i$ and $70_{i+1}$ (e.g., about 4.0 millimeters) and the printing resolution along the y-axis defined by y-axis diode offsets 84 (e.g., about 50 micrometers).

This same arrangement can be used for each array 70 of laser emitters 30. For instance, laser emitters $30_{(i+1,1)}, 30_{(i+1,2)}, \ldots, 30_{(1+1,80)}$ of array $70_{i+1}$ may also be oriented at angle 88 relative to the x-axis. This positions the last laser emitter $30_{(i+1,80)}$ of array $70_{i+1}$ at about the same y-axis diode offset 84 from the first laser emitter $30_{(i+2,1)}$ of the adjacent array $70_{i+2}$.

The actual value for angle 88 may vary depending on the y-axis array offsets 82 between adjacent arrays 70, the voxel printing resolution (corresponding to the y-axis diode offsets 84), and the x-axis row offset 86 along the x-axis. As mentioned above, the x-axis row offset 86 for each array 70 may vary depending on the cross-sectional dimensions of the hot interface segments 78a of heat pipes 78 and channels 80. Examples of suitable distances for each x-axis row offset 86 range from about 4.5 millimeters to about 10 millimeters, from about 5 millimeters to about 8 millimeters, and/or in some preferred embodiments, from about 5 millimeters to about 7 millimeters. These dimensions provide good heat transfer properties between laser emitters 30 and heat pipes 78, while also maintaining good structural integrity for interior frame 54 of base block 50.

Accordingly, for a y-axis array offset 82 of about 4.0 millimeters, an x-axis row offset 86 of about 6.0 millimeters, and a voxel printing resolution of about 50 micrometers, each array 70 will require eighty laser emitters 30 and will have a total length along the x-axis of about 480 millimeters (about 19 inches). Furthermore, to print a swath width 32 of about 51 millimeters (about 2 inches), this will require about thirteen arrays 70 of laser emitters 30.

On the other hand, for the same set up with a printing resolution of about 25 micrometers, each array 70 will require 160 laser emitters 30 and will have a total length along the x-axis of about 960 millimeters (about 38 inches). However, to print a swath width 32 of about 51 millimeters (about 2 inches), this will still require about thirteen arrays 70 of laser emitters 30.

FIGS. 12 and 13 illustrate an example configuration for laser emitters 30 in laser assembly 12, which is based on a standard-packaged, diode-based laser chip 90, where FIG. 12 illustrates adjacent laser emitters 30 extending (obliquely) in a row of an array 70 along the x-axis, and FIG. 13 illustrates adjacent laser emitters 30 extending in a row of the array 70 along the y-axis. As shown, laser chip 90 can include a base member 92, connector pins 94, thermal spreader 96, laser diode 98, monitor diode 100, protective casing 102, and window 104. Base member 92 is the portion of laser chip 90 having widest diameter, referred to as diameter 106, and which can range from about 3.0 to about 3.5 millimeters, for example. Connector pins 94 extend through base member 92 and are connected to laser control boards 72 with one or more electrical connections, such as wires (not shown).

Thermal spreader 96 is a heat sink device configured to draw heat from laser diode 98 to base member 92. Laser diode 98 is a semiconductor-based diode wired to one of the connector pins 94, and configured to generate a laser beam 108 based on commands from controller assembly 26, controller 26a, and/or and control board(s) 72. Monitor diode 100 is also electrically coupled to one of the connector pins 94, and is configured to manage power levels of laser diode 98. Protective casing 102 hermetically seals the components of laser chip 90, and window 104 allows laser beam 108 to emit out of laser chip 90. As mentioned above, laser chip 90 can typically produce an ultraviolet-wavelength laser beam (e.g., about 405 nanometers) having about 50 milliwatts of power. It has been found that laser chip 90 can demonstrate voxel printing resolutions of about 50 micrometers with movement speeds of laser assembly 12 along the x-axis up to about 150 inches/second.

As further shown in FIGS. 12 and 13, laser emitter 30 also preferably includes relay optics 110 for demagnifying and imaging the emitting facet of laser beam 108 onto the top surface of the resin film or 3D part, referred to as surface 112. The demagnified laser beam 108 that is emitted from relay optics 110 is referred to as laser beam 108a. In the shown example, relay optics 110 include a ball lens secured within channel 68. However, any suitable optical lens or lenses may be used, such as lenses under the trademark "SELFOC" from Go!Foton Group having a location in Somset, NJ, ball lenses, drum lenses, Coddington lenses, and the like. Additionally, each channel 68 can include a first shoulder 114 for retaining laser chip 90 adjacent to top surface 64, a second shoulder 116 for retaining relay optics 110 at a set distance from laser chip 90 to properly demagnify and focus laser beam 108.

In the shown example, relay optics 110 are positioned about midway between top surface 64 and bottom surface 66 of interior frame 54. This is due in part to the desired thickness of interior frame 54 between top surface 64 and bottom surface 66, and the location of laser chip 90. In particular, for mechanical stability, interior frame 54 preferably has a thickness along the z-axis of at least about 10 millimeters, more preferably from about 10 millimeters to about 20 millimeters, and in some embodiments, from about 12 millimeters to about 15 millimeters. Accordingly, to provide ease of access to laser chips 90 (e.g., for connecting them to laser control boards 72 and/or for field replacements of dead laser chips 90), laser chips 90 are mounted in channels 68 at top surface 64.

This positions relay optics 110 at a set location below laser diode 98 for proper demagnification concentrating and imaging of the emitted laser beam 108. As such, in the shown embodiment, relay optics 110 are located within channel 68 a distance from bottom surface 66 (e.g., as set by shoulder 116) by offset height 110a. As can be appreciated, the height of laser assembly 12 above surface 112, referred to as focus height 110b, is preferably based on the focal length of laser beam 108a, such that laser beam 108a focuses on surface 112 with a single-voxel resolution (e.g., of about 50 micrometers, about 25 micrometers, or even smaller).

During the manufacture of laser assembly 12, channels 68 are preferably machined into interior frame 54 with high precision, particularly for the locations of shoulders 114 and 116. This allows laser chips 90 and relay optics 110 to be secured within channels 68 at accurate locations and alignments along the z-axis for proper demagnification and imaging of laser beam 108a. As such, laser gantry 24 preferably carries laser assembly 12 at a working distance above surface 112, referred to as working distance 66a from bottom surface 66, that maintains the focus height 110b for laser beam 108a for each laser emitter 30.

Examples of suitable focus heights 110b for relay optics 110 above surface 112 range from about 3 millimeters to about 20 millimeters, from about 4 millimeters to about 15 millimeters, and/or from about 5 millimeters to about 10 millimeters. Because relay optics 110 are mounted in channel 68 above bottom surface 66 by offset distance 110a, the working distance 66a between bottom surface 66 of base block 50 and surface 112 will be the difference between the focal height 110b and the offset height 110a.

Figure 14:
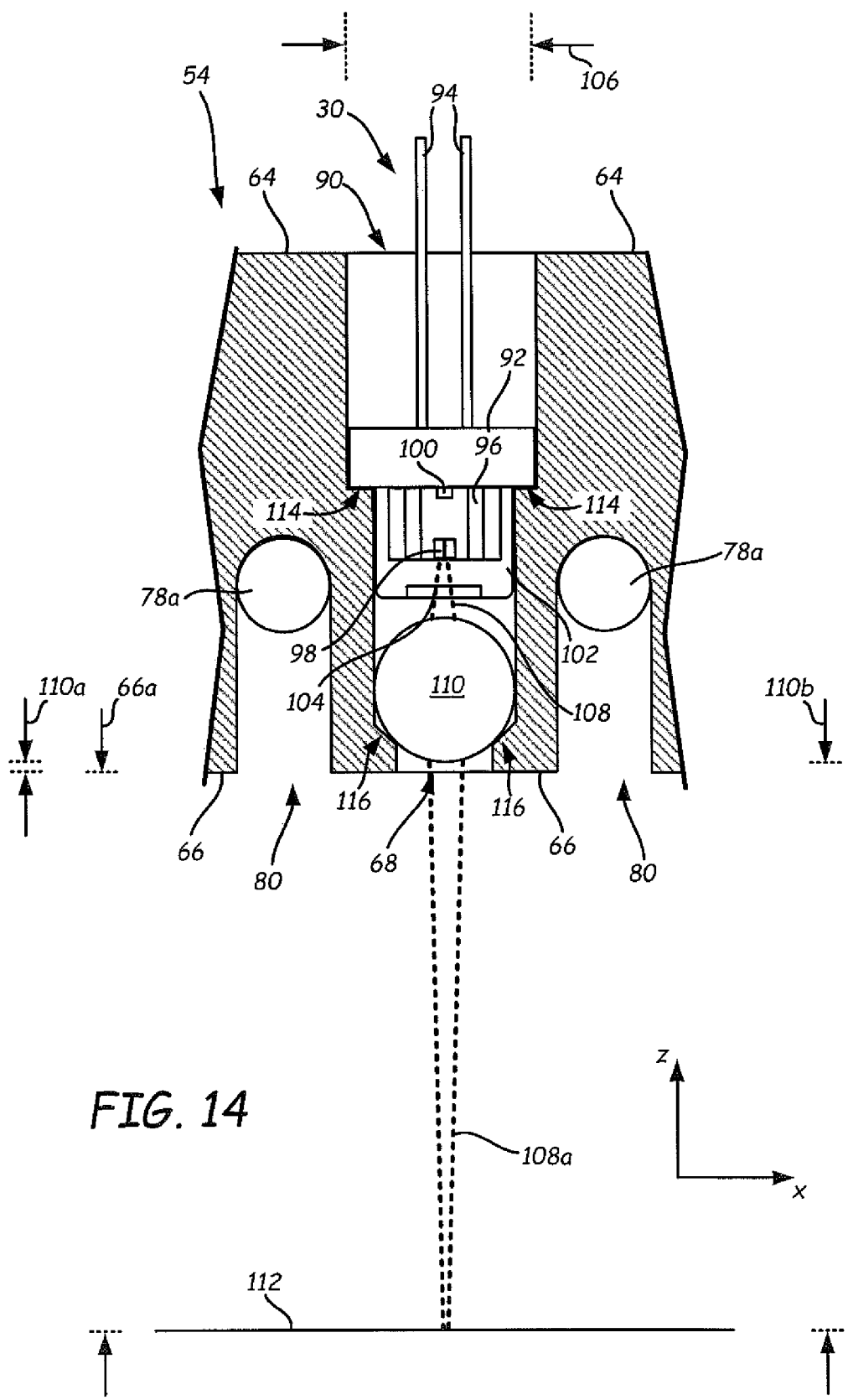
FIG. 14 is a sectional view taken along an x-z plane, further illustrating alternative laser emitters that are positioned closer to a bottom surface of the laser assembly.

However, in alternative embodiments, laser chip 90 and relay optics 110 can be mounted lower in channel 68. For instance, as shown in FIG. 14, laser chip 90 and relay optics 110 can be mounted such that relay optics 110 are positioned within channel 68 at or almost at bottom surface 66. In this case, heat pipe 78 and slot 80 can be positioned at about the same height as laser diode 98. This embodiment raises the working distance 66a of bottom surface 66 to a higher elevation compared to the embodiment shown in FIGS. 12 and 13, which can be beneficial for preventing heat from radiating from laser assembly 12 to the resin at surface 112.

In either embodiment shown in FIGS. 12-14, laser diode 98 typically emits laser beam 108 with an elliptical cross-section having a minor axis and a major axis. The minor axis of laser beam 108 can be about one micrometer or less, and the major axis of laser beam 108 can range from about 5 micrometers to about 7 micrometers, for example.

Preferably, laser diode 98 is positioned such that the major axis of laser beam 108 is oriented normal to the direction of movement along the x-axis. In other words, in the current example, laser chip 90 is preferably mounted in channel 68 such that laser diode 98 emits laser beam 108 with the major axis substantially parallel to the y-axis, as illustrated in FIG. 13. In comparison, as illustrated in FIGS. 12 and 14, the minor axis of laser beam 108 can be substantially parallel to the x-axis.

Relay optics 110 can provide from about 3× to about 5× demagnification of laser beam 108, for example. This can result in a numerical aperture for the laser beam 108 emitted towards surface 112 to be about 0.3 or more.

In the current embodiment for laser assembly 12 with the pre-packaged laser chips 90, the 1-millimeter for relay optics 110 is typically less than the diameter of laser chip 90. However, as discussed below, in other embodiments in which laser chip 90 is customized for use with laser assembly 12, the minimum diameter of relay optics 110 can limit the laser packing density of laser emitters 30.

Laser assembly 12 with the architecture shown in FIGS. 1-14 is suitable for many applications, and can print 3D parts with high voxel resolutions and fast rates. However, in some preferred embodiments in which system 10 is intended print 3D parts with even faster printing speeds, laser assembly 12 is preferably configured to operate with fewer rows of laser emitters 30 along the x-axis. In other words, each array 70 preferably includes fewer numbers of laser emitters 30 to reduce the length of laser assembly 21 along the x-axis.

The length of laser assembly 12 along the x-axis can significantly depend on the packing density of laser emitters 30 and the printing resolution. In the above-discussed example where each array 70 extends along the x-axis by about 480 millimeters (about 19 inches), and for a two-inch scan length 44 for build envelope 34, gantry 24 needs to move laser assembly 12 at least about 21 inches to have each laser emitter 30 pass over the two-inch span of build envelope 34. As such, the size of overhead region 18 along the x-axis is more than ten times greater than scan length 44 for build envelope 34. Moreover, the actual movement distance may be even greater to account for accelerations and decelerations of layer assembly 12, as indicated by distance 36a (shown in FIG. 1) and distance 38a (shown in FIG. 3).

Furthermore, in the above-discussed example where each array 70 extends along the x-axis by about 960 millimeters (about 38 inches), and for the same build envelope 34, gantry 24 needs to move laser assembly 12 at least about 40 inches to have each laser emitter 30 pass over the two-inch span of build envelope 34 (not accounting for distances 36a and 38a). In this case, the size of overhead region 18 along the x-axis is about twenty times greater than scan length 44 for build envelope 34.

As can be appreciated, these size ratios between overhead region 18 and build envelope 34 can require system 10 to be large relative to the printable part size. Additionally, these extra overpass distances that laser assembly 12 needs to traverse along the x-axis during each pass can affect the printing speed of system 10. As such, FIGS. 15-21 illustrate a second embodiment of laser assembly 12, in which the laser packing density is increased. This accordingly reduces the length of laser assembly 12, which may accordingly allow laser assembly 12 to complete each pass over platform 20 in a shorter duration, thereby increasing printing speeds.

As discussed below, the increased laser packing density is achieved by uniquely repacking laser emitters 30 in the base block 50 in a manner that reduce their individual dimensions, as well as improving their heat transfer characteristics. In fact, it has been found that, when the laser packing density reaches a critical point, heat transfer characteristics can become the limiting factor rather than the packaging dimensions of the laser emitters 30. As such, laser assembly 12 in this second embodiment balances the heat transfer characteristics and the laser packing density to achieve a design that is shorter in length along the x-axis, has increased heat removal, and can be modular for field repair and replacement.

Figure 15:
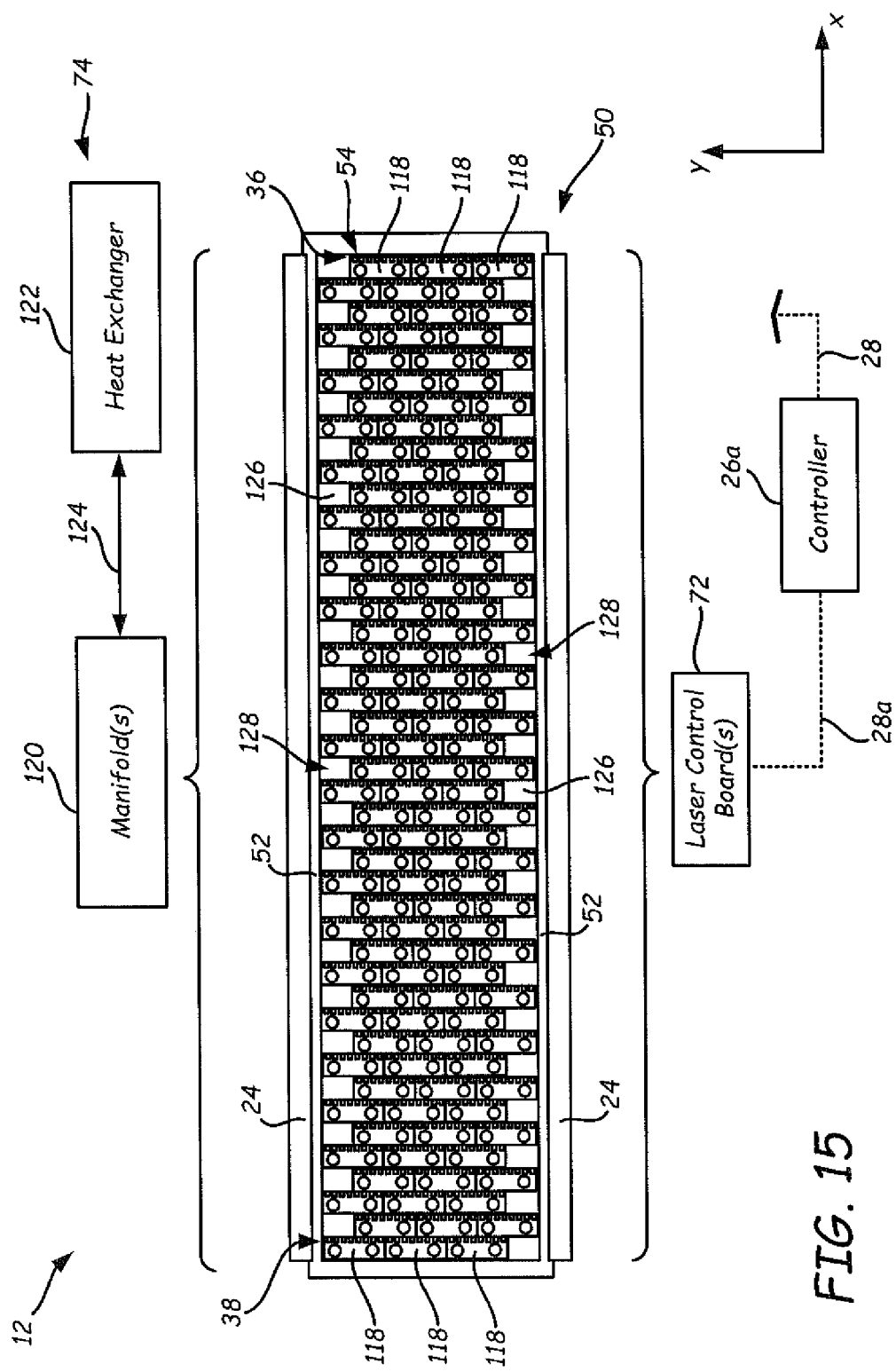
FIG. 15 is a top view of a second embodiment of a laser assembly of the present disclosure, which may be used with the additive manufacturing system.

As shown in FIG. 15, laser assembly 12 of this embodiment may also include a base block 50 having a perimeter frame portion 52 and an interior frame portion 54. In this embodiment, however, interior frame portion 54 is preferably assembled from multiple, connectable sub-blocks 118, which may be retained within perimeter frame portion 52. As such, perimeter frame portion 52 preferably retains sub-blocks 118 in a rigid manner to prevent sub-blocks 118 from shifting relative to each other and to perimeter frame portion 52. As mentioned above, to ensure good printing resolutions, in preferred embodiments, base block 50 is dimensionally rigid such that sag and vibrations are less than 50 micrometers root-mean-square along the x-axis and the y-axis. In the shown example, interior frame portion 54 is made up of 42 rows of sub-blocks 118, where each row includes three sub-blocks 118, for a total of 126 sub-blocks 118. However, laser assembly 12 may include any suitable number of sub-blocks 118 extending along the y-axis in each row.

Laser assembly 12 also preferably includes one or more laser control boards 72 and one or more controllers 26a, as discussed above. In this embodiment, laser control boards 72 may be connected to the individual sub-blocks 118 with electrical connections (e.g., flex cables and ZIF connectors). This allows controller assembly 26, controller 26a, and/or laser control boards 72 to separately and independently operate each laser emitter 30.

In this embodiment, heat sink assembly 74 is preferably based on a liquid-cooling architecture, and may include one or more manifolds 120 and one or more heat exchangers 122. Manifold(s) 120 are preferably carried, at least in part, along with laser assembly 12, and route a coolant fluid, such as but not limited to water, through each sub-block 118 and back to heat exchanger 122 over one or more conduits 124. Heat exchanger 122 is configured to circulate and re-cool the coolant liquid to draw the heat produced by laser emitter 30 away from laser assembly 12. In some embodiments, heat exchanger 122 is maintained at a fixed location in system 10, where conduit(s) 124 allow laser assembly 12 to move freely along the x-axis. Alternatively, heat exchanger 122 may also be carried with laser assembly 12.

In some embodiments, heat sink assembly 74 may incorporate other thermal solutions, such as heat pipes, conveyor cooling, other thermally-conductive materials (e.g., pyrolytic graphite and diamond materials), and/or liquid metal convection. For liquid metal convection, the coolant liquid that flows through manifold(s) and sub-blocks 118 may include materials such as sodium potassium (NaK) alloys, gallium indium tin (GaInSn) eutectic alloys, and the like. These fluids exhibit excellent heat conduction and specific heat properties, and can be magnetohydrodynamically pumped, requiring no moving mechanical parts for their circulation. In further embodiments, as discussed below, heat sink assembly 74 may incorporate immersion cooling.

Figure 16:
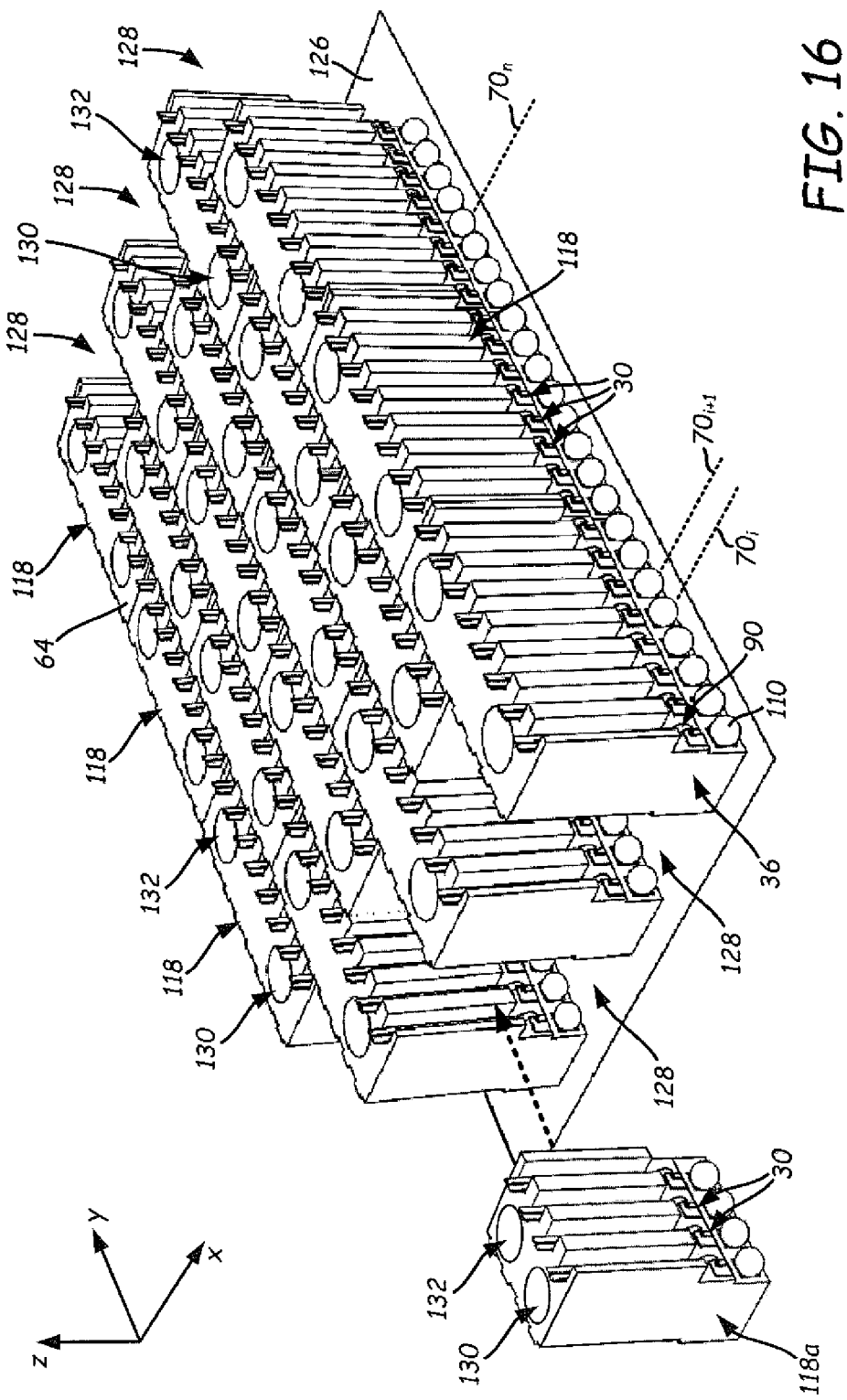
FIG. 16 is a top front perspective view of a portion of the second embodiment of the laser assembly.

As further shown in FIG. 15, and better shown in FIG. 16, laser assembly 12 may also include an underlying window 126, which encases the bottom side of laser assembly 12 to protect laser emitters 30, but allow the transmission of laser beams 108a. FIG. 16 illustrates a portion of interior frame 54, depicting a leading segment of the connected sub-blocks 118 that includes leading row 36 of laser emitters 20.

Each sub-block 118 includes a set of laser emitters 30 corresponding to part of a row along the y-axis. As can be seen, sub-blocks 118 are connected in a staggered manner. This arranges laser emitters 30 in arrays 70 extending obliquely along the x-axis, as discussed above. However, as discussed below, in a preferred embodiment, each laser emitter 30 includes a dual-channel laser diode 98 for each relay optics 110, where the dual-channel laser diode 98 preferably produces laser beams 108a with focal points that are space apart from each other along the y-axis by the voxel printing resolution or y-axis diode offset 84 (e.g., by about 25 micrometers). This effectively reduces the length of each array 70 by 50% compared to the first embodiment discussed above in FIGS. 1-13.

In the current example, the staggered arrangements may require the first four arrays 70 and the last four arrays 70 to be disabled or otherwise not used during normal operation. This is because the staggered arrangements produce gaps 128 between the adjacent rows of laser emitters 30. In this case, the first array 70, may actually be the fifth array 70 along the y-axis, and the last array 70$_n$ may actually be the fifth-from-last array 70 along the y-axis.

In alternative embodiments, sub-blocks 118 may have different lengths along the y-axis, allowing gaps 128 to be filled with laser emitters 30. For instance, a portion of the sub-blocks 118 may be smaller in size to fill in gaps 128, such as sub-block 118a shown in FIG. 16, which includes four laser emitters 30, and may be connected to the stack of sub-blocks 118 in each gap 128. Alternatively (or additionally), the edge-most sub-blocks 118 may have additional laser emitters 30 (e.g., twelve laser emitters 30) and extend into the locations of gaps 128. In either of these alternative embodiments, the laser emitters 30 in each array 70 may be used during operation.

Each sub-block 118 (and sub-block 118a) may also include a pair of ports 130 and 132 extending into the top surface 64, which may also connect to manifold(s) 120. Port 130 is an inlet port for receiving a pressurized flow of the cooled fluid from heat exchanger 122 and manifold(s) 120 into the given sub-block 118. Correspondingly, port 132 is an outlet port for discharging the fluid after drawing a portion of the heat from the sub-block 118, and relays the heated fluid back to an outgoing channel in manifold(s) 120.

Figure 17:
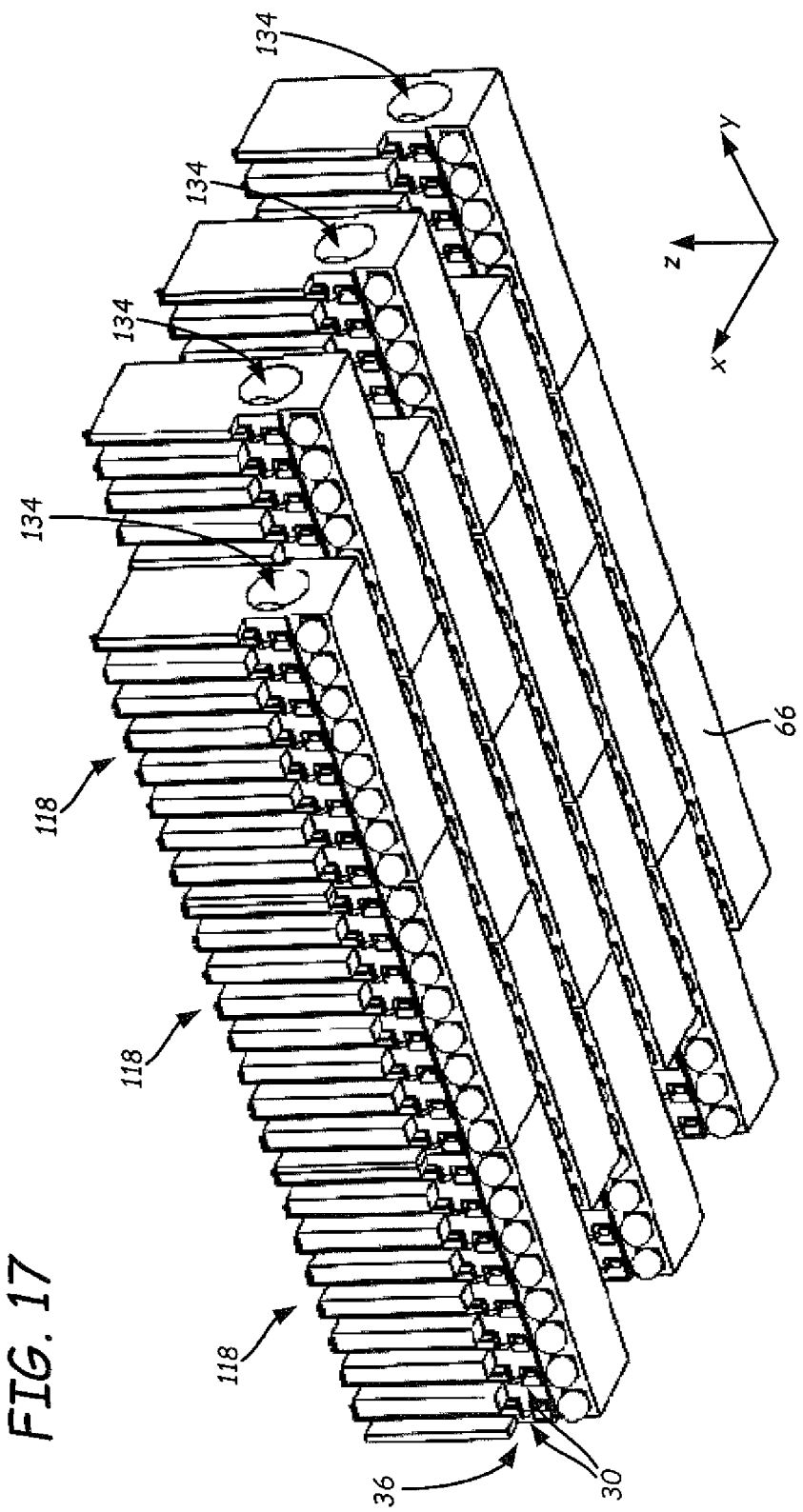
FIG. 17 is a bottom rear perspective view of the portion of the second embodiment of the laser assembly shown in FIG. 16.

As shown in FIG. 17, where window 126 is omitted for ease of discussion, each sub-block 118 may also include a cross channel 134 machined through one lateral side of the given sub-block 118 to interconnect ports 128a and 128b. The bored end of cross channel 130 is preferably sealed prior to use, thereby creating a fluid flow path in through inlet port 128a, through cross-channel 130, and out through outlet port 128b. This generates the fluid cooling for each sub-block 118, allowing large amounts of heat to be drawn away from laser assembly 12. Heat sink assembly 74 used in combination with ports 128a and 128b, and cross channel 130, preferably prevents laser assembly 12 from exceeding about 25° C., 20° C., and/or 10° C. above room temperature (e.g., less than about 50° C., 45° C., and/or 35° C.), as discussed above.

Figure 18:
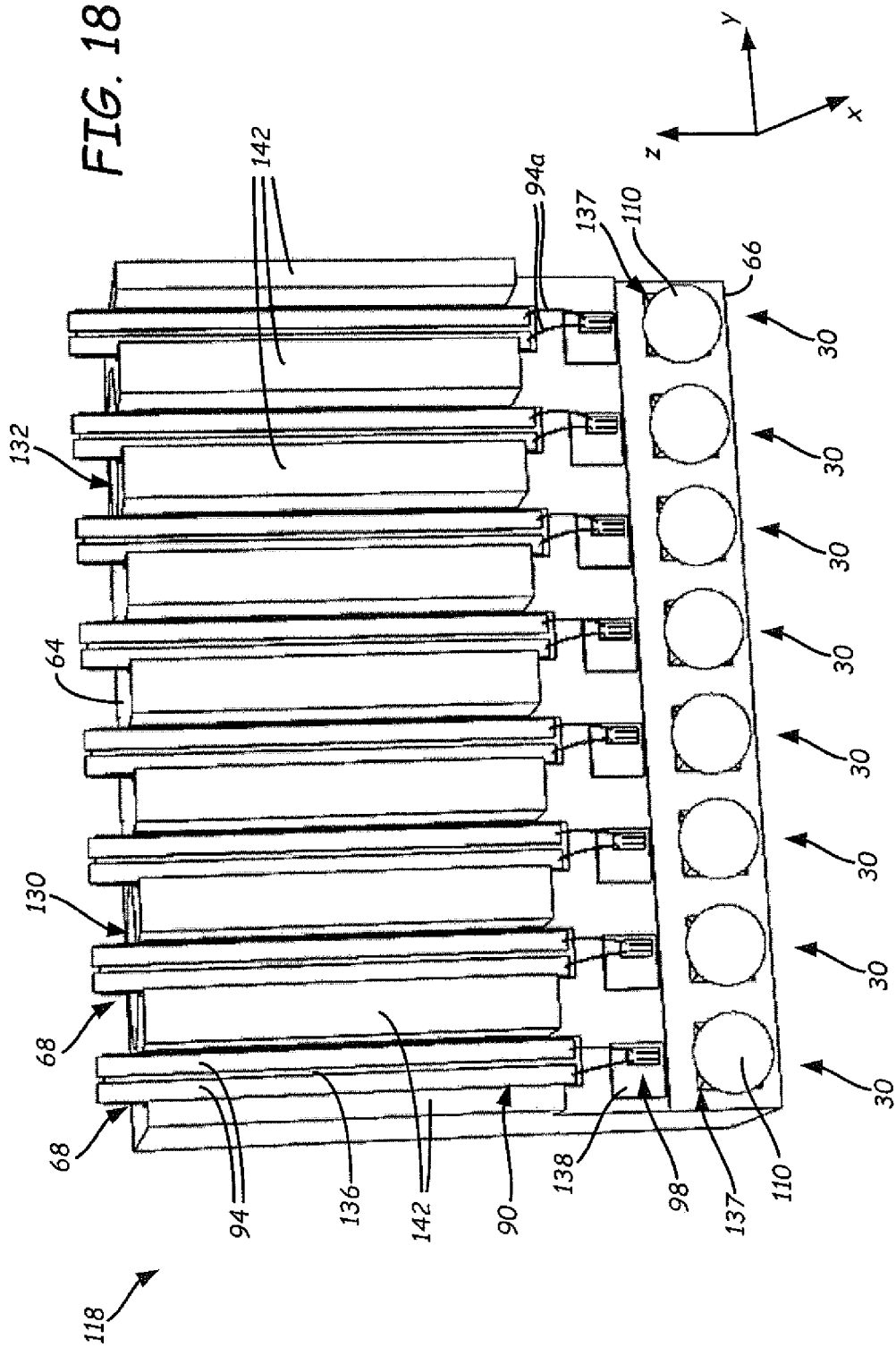
FIG. 18 is a front perspective view of a sub-block of the second embodiment of the laser assembly.

FIG. 18 further illustrates an exemplary sub-block 118. As shown, each laser emitter 30 is repackaged in a manner that utilizes sub-block 118 itself for physical support, heat removal, and protection. In particular, sub-block 118 includes machined channels 68, which in this embodiment are U-shaped slots rather than internal bores (as shown above in the first embodiment). This allows connector pins or electrodes 94 to be fabricated as traces (e.g., copper traces) on an underlying flexible printed circuit board 136 that electrically isolates electrodes 94 from sub-block 118 within channel 68. Electrodes 94 may correspondingly connect to laser diode 98 with electrical wires 94a.

In effect, the base member 92, protective casing 102, and window 104 have been removed, which reduces the cross-sectional dimensions of laser chip 90, and can significantly increase the rate of heat removal into sub-block 118. In this embodiment, each channel 68 and laser chip 90 is aligned along the z-axis with its own relay optics 110, where relay optics 110 are secured to (e.g., adhered to) alignment pockets 137. This allows laser chips 90 and relay optics 110 to be secured to sub-block 118 at accurate locations and alignments along the z-axis for proper demagnification and imaging of laser beams 108a.

Furthermore, as mentioned above laser diode 98 in this embodiment is preferably a dual-channel laser diode secured to sub-block 118 with a thermally-conductive sub-mount 138 (e.g., formed from copper tungsten). As discussed below, controller assembly 26, controller 26a, and/or laser control board(s) 72 can command the dual-channel laser diode 98 to selectively and independently emit adjacent laser beams 108 into a common relay optics 110. This is achievable because a substantial portion of the packaging for laser chip 90 is eliminated, thereby reducing the cross-sectional dimensions of laser chip 90 in this embodiment. Moreover, it allows the center-to-center offsets 82 along the y-axis between adjacent arrays 70 to be reduced, thereby further increasing the laser packing density.

However, as discussed above, when the laser packing density reaches a critical point, heat transfer characteristics can become the limiting factor for the laser packing density. Light emitters 30 configured to emit ultraviolet-wavelength light typically have about 10% power efficiencies. As such, for light emitters 30 with average laser power outputs of about 50 milliwatts, the amount of energy released as heat can reach up to about 0.5 watts per laser emitter 30. For sub-blocks 118 machined from aluminum having a thermal conductivity of about 167 watts/meter-° C., the heat generation limit is about 13,000 watts/square meter. So, in this example, the maximum packing density of laser emitters 30 is about 26,000 laser emitters 30 per square meter, which corresponds to a 4-inch×4-inch cross section. In other words, the minimum distance for each of center-to-center offset 82 (along the y-axis) and center-to-center offset 86 (along the x-axis) is about four inches.

In this case, liquid water cooling with heat sink assembly 74 can move about 50 kilowatts/square meter of heat with a one-degree Celsius gradient through sub-blocks 118. If, for example, a third of the available temperature drop is allocated to moving heat from laser diode 98, through sub-mount, and into sub-block 118, a third of the heat is allocated to moving the heat through sub-block 118 to the water flowing through cross channel 130, and a third of the heat is carried away with the water transfer, this results in about 0.3 megawatts/square meter that can potentially be dissipated, assuming the path length through the bulk of sub-block 118 is about 4 millimeters or less. This corresponds to an achievable laser packing density of about 1.7 square millimeters per laser emitter 30. Moreover, if chilled water is used for the coolant fluid in heat sink assembly 74, the achievable laser packing density can potentially be reduced down less than one square millimeter per laser emitter 30.

The increased cooling accordingly switches the limiter for the achievable laser packing density back to the dimensions of laser emitter 30. As discussed above, the major axis for laser beam 108 emitted from laser diode 98 is preferably oriented along the y-axis. Then, pursuant to Equation 1, for a working distance of 5 millimeters, a 3× demagnification, and a numerical aperture of 0.3, the minimum diameter for relay optics 110 along the y-axis is about one millimeter. This accordingly limits the achievable laser packing density between adjacent arrays 70 along the y-axis, as defined by center-to-center offset 82, to about two millimeters.

Figure 19:
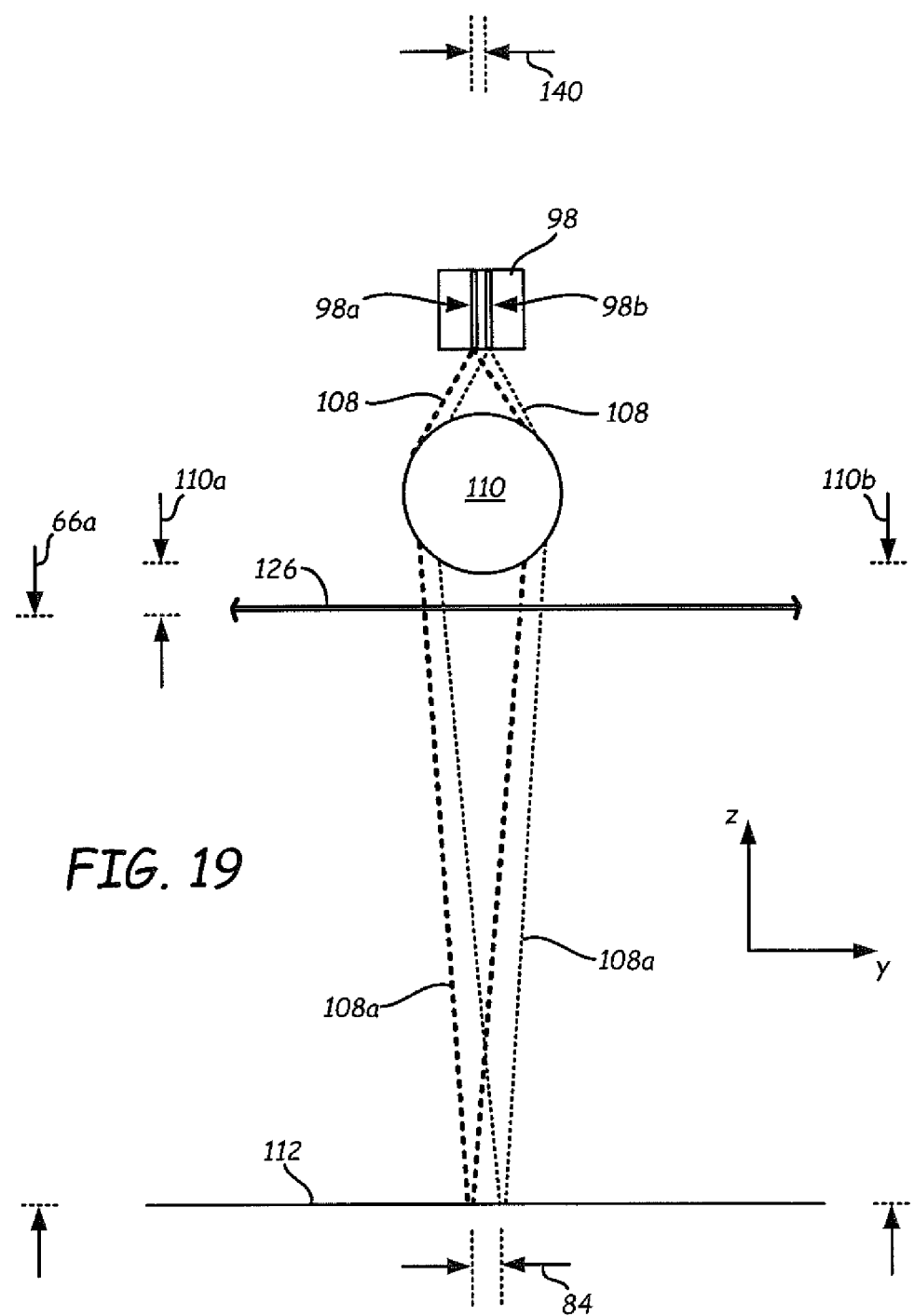
FIG. 19 is a sectional view taken along a y-z plane, illustrating a laser emitter of the second embodiment of the laser assembly.
Figure 20:
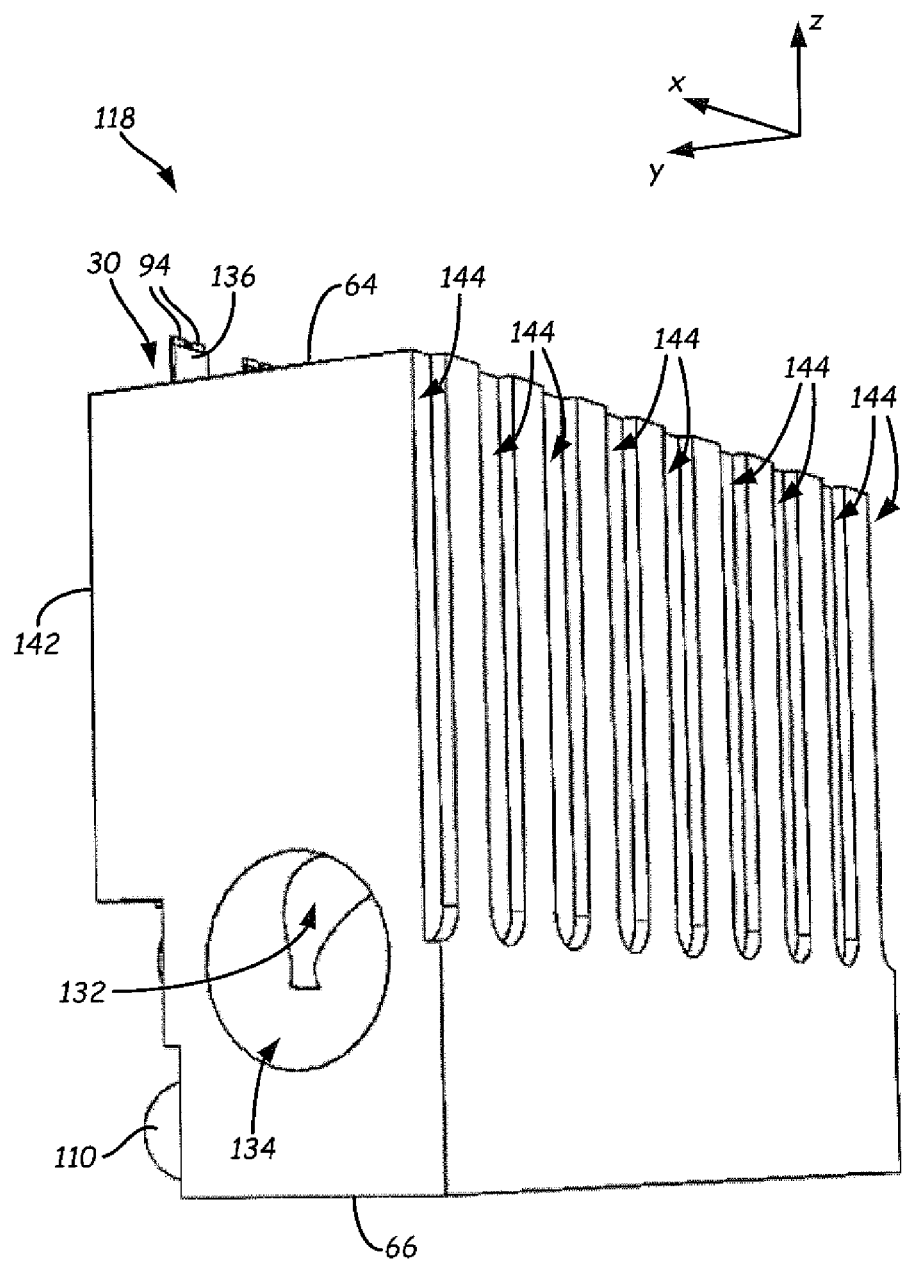
FIG. 20 is a rear side perspective view of the sub-block shown in FIG. 18.
Figure 21:
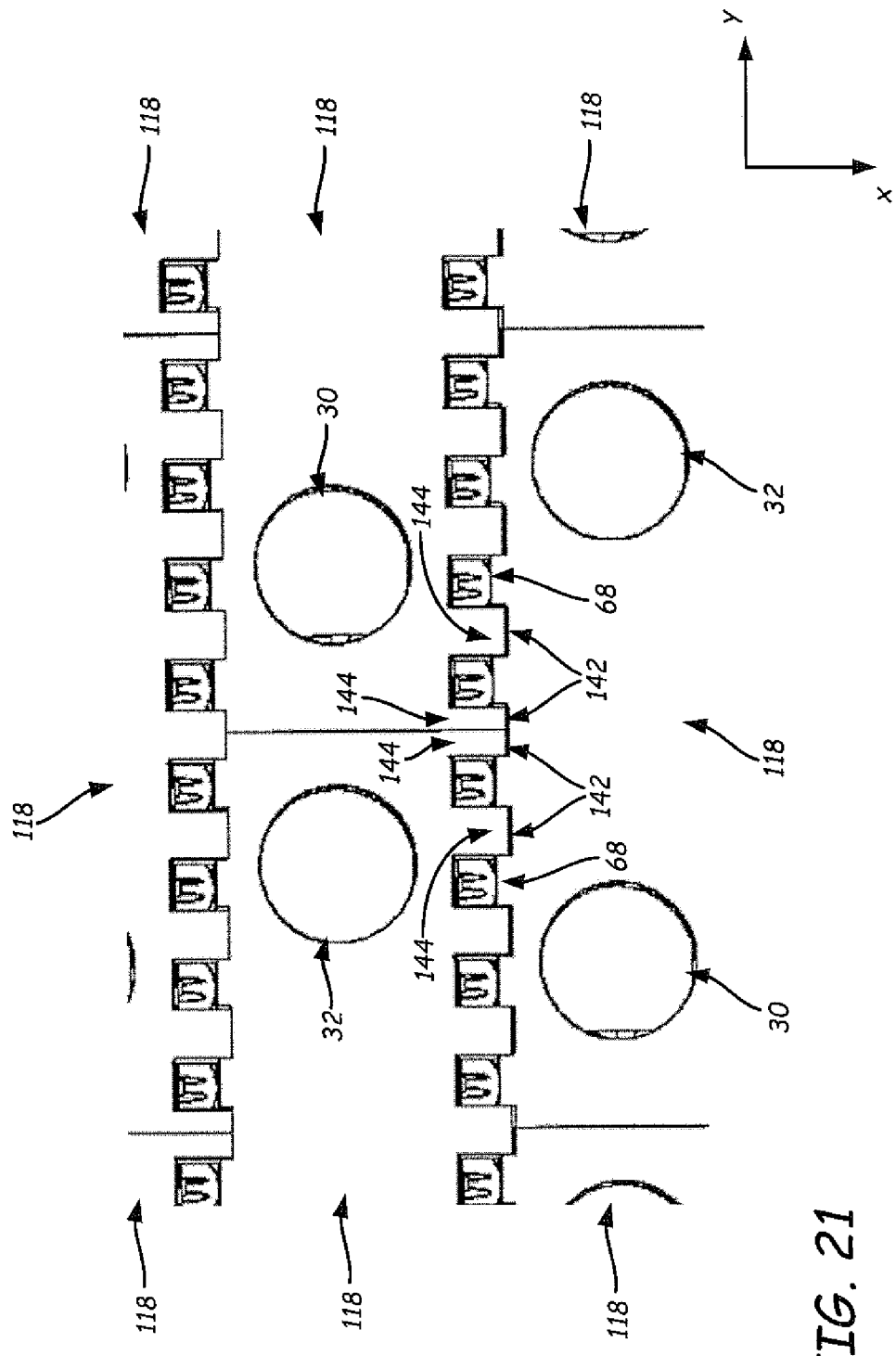
FIG. 21 is a top view of a portion of the second embodiment of the laser assembly, illustrating interlocked sub-blocks.

As shown in FIG. 19, however, each relay optics 110 can be used with a dual-channel laser diode 98, which effectively doubles the laser packing density. Dual-channel laser diode 98 includes first channel 98a and second channel 98b, which are preferably spaced apart from each other along the y-axis by distance 140, which is the voxel printing resolution (e.g., 25 micrometers) divided by the optical demagnification of relay optics 110. This arrangement allows channels 98a and 98b to be separately and independently used to generate laser beams 108 that are spaced apart from each other along the y-axis, as shown.

The same relay optics 110 may then image and demagnify each laser beam 108, independently of each other, to produce the pair of spaced apart laser beams 108a having focal points that are preferable offset from each other along the y-axis by the voxel printing resolution (corresponding to center-to-center offset 84). This effectively reduces the achievable laser packing density along the y-axis to about one millimeter.

The use of the dual-channel laser diode 98 can accordingly reduce the number of laser emitters 30 needed to compensate for the difference between the center-to-center offsets 82 and 84. For example, for a center-to-center offset 82 along the y-axis of about 1.0 millimeter, a center-to-center offset 86 along the x-axis of about 6.0 millimeters (due to the dimensions of each sub-block 118), and a voxel printing resolution of about 25 micrometers, each row in the y direction of array 70 will require twenty laser emitters 30 (and twenty sub-blocks 118) and will have a total length along the x-axis of about 240 millimeters (about 10 inches). In some cases, the center-to-center offset 86 along the x-axis can be reduced down to within about 5.5 millimeters to about 6.0 millimeters, which can reduce the length along the x-axis (e.g., down to about 9 inches).

In alternative embodiments, one or more laser diodes 98 may include channels 98a and 98b that are closer together than distance 140, which can potentially have many useful applications. For instance, while the channels 98a and 98b will still generate laser beams 108a with separate resolvable spots on surface 112, one of the channels may be used as backup when the other channel fails for redundancy.

The length of each sub-block 118 may vary depending on the number of laser emitters 30 and the laser packing density. For instance, sub-blocks 118 are illustrated in FIGS. 15-18 with eight laser emitters 30, which provide sixteen laser channels. For a y-axis diode offset 84 of 2.0 millimeters, this provides a y-axis length of about 16 millimeters. In comparison, the x-axis thickness of each sub-block 118 can range from about 5.5 millimeters to about 6.0 millimeters, for example.

In some preferred embodiments, each sub-block 118 may include additional numbers of laser emitters 30, such as 16 laser emitters 30 (32 laser channels, y-axis length of about 32 millimeters), 32 laser emitters 30 (64 laser channels, y-axis length of about 64 millimeters), 64 laser emitters 30 (128 laser channels, y-axis length of about 128 millimeters), or more. The number of laser emitters 30 per sub-block 118 is accordingly limited by the rate at which the cooling fluid flowing through ports 130 and 132, and cross channel 134 can draw heat away from the given sub-block 118.

As can be appreciated, each sub-block 118 is modular and self-contained, allowing sub-blocks 110 to be added to laser assembly 12 to achieve any suitable swath width 32 for build envelope 34. Moreover, the printing speed of laser assembly 12 depends on its movement speed and the distance along the x-axis it is required to traverse during each pass. The distance along the x-axis accordingly depends on the x-axis length of laser assembly 12 and the intended scan length 44 for build envelope 34.

In comparison, however, the printing speed of laser assembly 12 is substantially independent of its y-axis length because, in the shown embodiment, laser assembly 12 does not move along the y-axis (other than for particular purposes, such as for small randomized offsets along the y-axis to overcome potential laser failures). As such, laser assembly 12 can effectively cover any suitable swath width 32 that is desired. Another benefit of this architecture is that scan stitching can be avoided since laser array 16 does not move back-and-forth in a raster pattern for the same layer.

Sub-blocks 118 are particularly suitable for extending the y-axis width of laser assembly 12 due to their modular and self-contained nature. Between each channel 68, sub-block 118 includes protruding bars 142 (shown above in FIG. 18) extending along the z-axis.

Protruding bars 142 are configured to align and mechanically lock with interlocking channels 144 (shown in FIG. 20) on the rear side of an adjacent sub-block 118. This allows multiple sub-blocks 118 to mechanically interlock in the staggered arrangement shown above in FIGS. 15-17, and as further shown in FIG. 21. This effectively allows any suitable number of sub-blocks 118 to be interconnected to achieve a desired swath width 32 for build envelope 34.

An exemplary arrangement for laser assembly 12 in this embodiment may include about 42 sub-blocks 118 (having dual-channel laser diodes 98) along the x-axis, providing about a 9-inch length for laser assembly 12, and which is capable of printing any desired scan length 44 with a voxel printing resolution of about 25 micrometers. For example, scan length 44 along the x-axis may range from one inch to about 100 feet, from about 25 feet to about 75 feet, and/or from about 40 feet to about 60 feet.

Additionally, the exemplary arrangement for laser assembly 12 may include about 15 sub-blocks 118 along the y-axis, where each sub-block 118 may include 32 laser emitters 30 (having dual-channel laser diodes 98), providing a y-axis length for each sub-block 118 of about 2.5 inches. This corresponds to a swath width 32 along the y-axis of about three feet, and includes 630 sub-blocks 118 and over 40,000 laser channels that can be independently operated. Alternatively, the exemplary arrangement for laser assembly 12 may include about 48 sub-blocks 118 along the y-axis. This corresponds to a swath width 32 along the y-axis of about ten feet, and includes 2,016 sub-blocks 118 and almost 130,000 laser channels that can be independently operated.

FIGS. 22-25 illustrate another embodiment for laser assembly 12 and heat sink assembly 74, which may be used in combination with any of the above-discussed embodiments. In this embodiment, heat sink assembly 74 may function as an immersion cooling assembly that circulates a coolant liquid directly across laser emitters 30 within channels 68, thereby generating an immersion optics arrangement.

Figure 22:
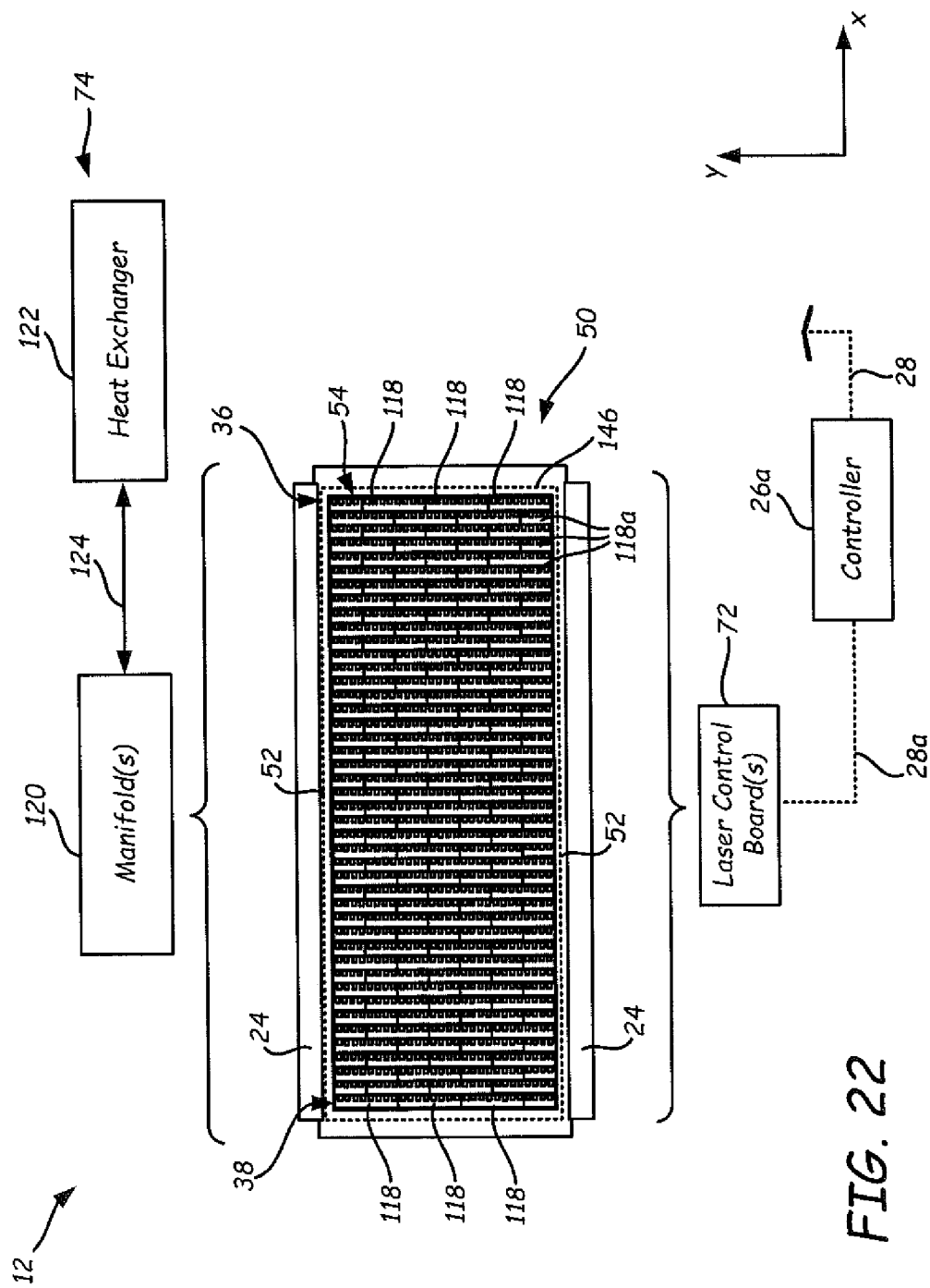
FIG. 22 is a top view of a third embodiment of the laser assembly of the present disclosure, which may be used with the additive manufacturing system.

As shown in FIG. 22, base block 50 (or at least sub-blocks 118) may be retained in an enclosable casing 146 with may be filled with the coolant fluid. In this case, manifold(s) 120 may be one or more conduits that direct the circulating coolant fluid between casing 126 and heat exchanger 122. The coolant fluid within casing 146 may flow through each channel 68 to directly draw heat away from each laser diode 96. As can be appreciated, the laser emission properties of laser emitters 30 are preferably adjusted to compensate for optical differences between air and the coolant fluid.

In other embodiments, manifold(s) 120 may be connected to each channel 68 with a conduit to direct the flows of the coolant fluid directly into each channel 68. These embodiments eliminate or otherwise reduce the need to immerse base block 50 in a bath of the coolant fluid. Furthermore, base member 92 and connector pins 94 of each laser emitter 30 can be configured to extend through the connecting conduit between manifold(s) 120 and channel 68, preferably in a sealed manner to prevent the coolant fluid from leaking. This architecture can be beneficial for interchanging the individual sub-blocks 118 without having to remove the entire base block 50 from casing 146.

Because the coolant fluid can draw the heat away directly from laser diodes 96, sub-blocks 118 may optionally be fabricated from non-thermally-conductive materials, such as one or more polymeric materials that provide a stiff, rigid structure for holding laser emitters 30. Moreover, because the coolant fluid can flow through channels 68, ports 130 and 132, and cross-channel 134 can be omitted. This arrangement allows the packing density of laser emitters 30 to be increased along the x-axis, thereby further reducing the length of laser assembly 12 along the x-axis.

The coolant fluid may be any suitable fluid that preferably does not interfere with the operation of electronic components, and that is preferably capable of efficiently drawing heat from laser diodes 98. Examples of suitable coolant fluid include those commercially available under the trademark "FLUORINERT" from 3M Company, Maplewood, MN Alternatively, laser diode 98 can optionally be encased in a hermetically-sealed housing with an emission window. This can expand the useable coolant fluids, such as halocarbon refrigerants (e.g., those commercially available under the trademark "FREON" from E. I. du Pont de Nemours and Company, Wilmington, DE).

Figure 23:
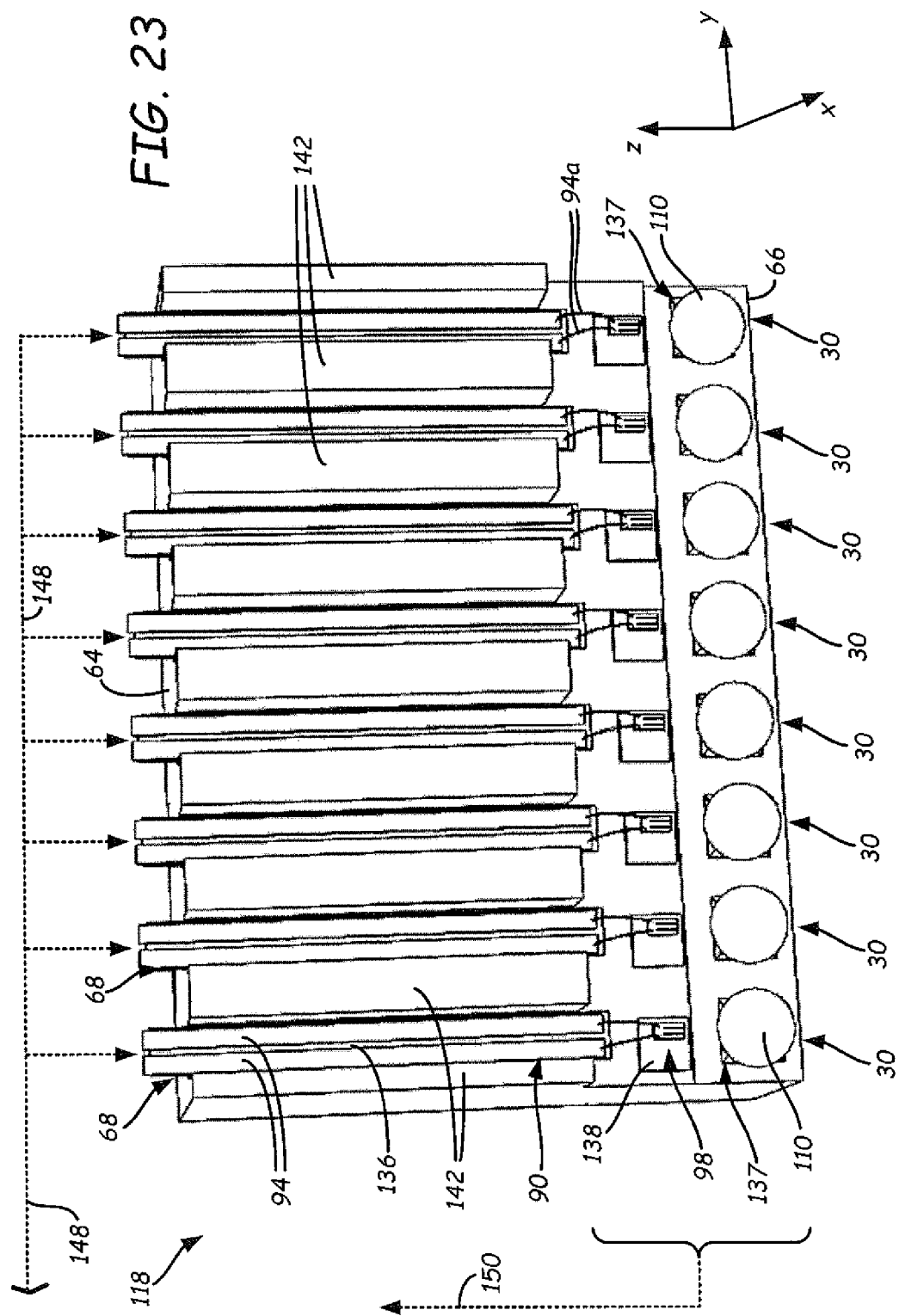
FIG. 23 is a front perspective view of a sub-block of the third embodiment of the laser assembly.

FIG. 23 illustrates an exemplary flow path for the coolant fluid. As shown, the coolant fluid may be supplied to laser assembly 12 under pressure such that the fluid can flow into each channel 68, as illustrated by arrows 148. In some aspects, protruding bars 142 may extend down past laser diodes 98 such that laser diodes 98 are also retained within channels 68. This ensures that the coolant fluid flows directly across each laser diode 98.

The underlying window 126 (not shown in FIG. 23) can function as a bottom surface for casing 146. As such, after passing through channels 68 and drawing the heat from laser diodes 98, the coolant fluid may flow laterally away from sub-blocks 118, as illustrated by arrow 150. Alternatively, the flow direction of the coolant liquid may be reversed such that the coolant liquid can flow upward through channels 68.

Figure 24:
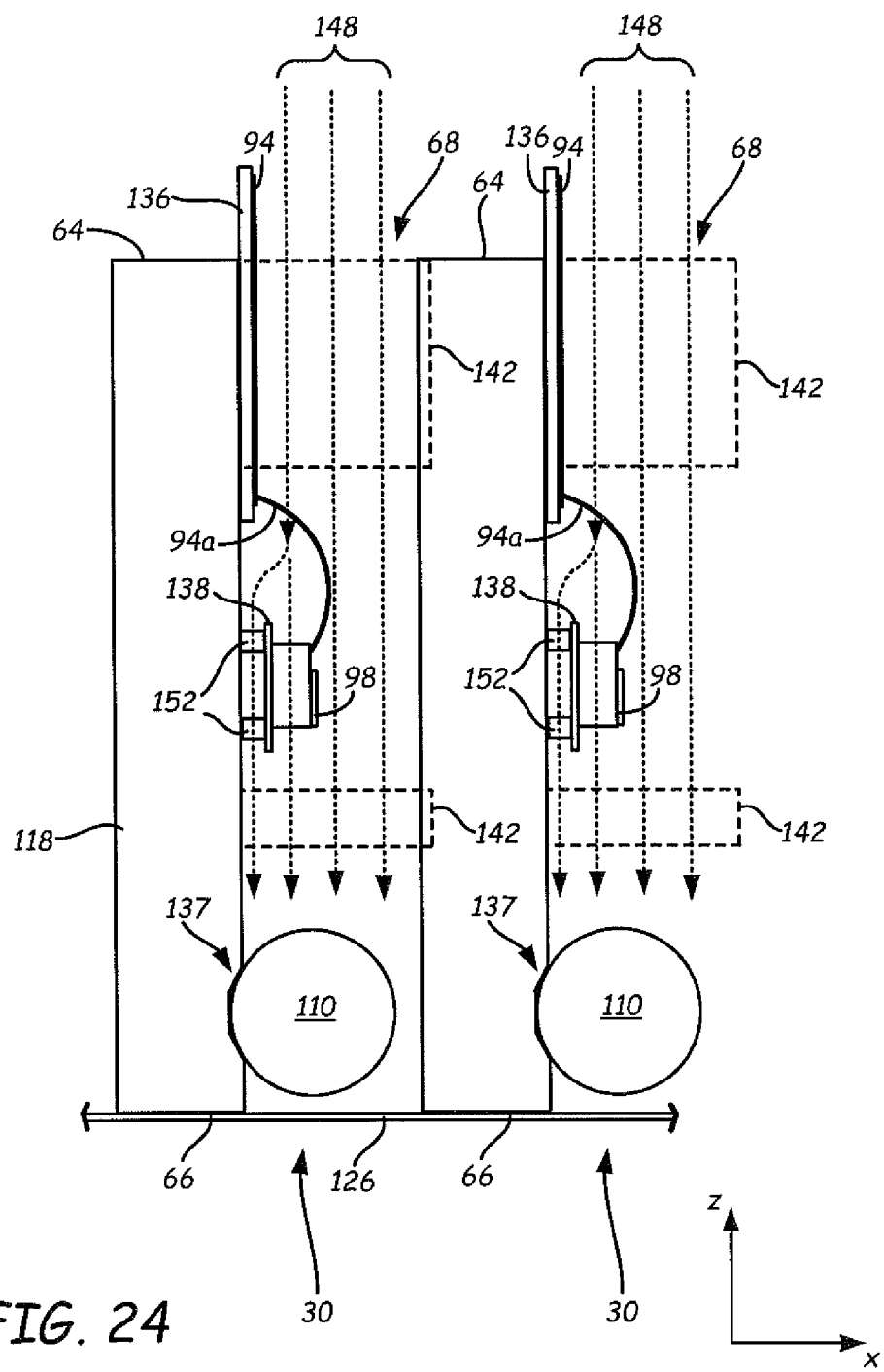
FIG. 24 is a side view of a first alternative sub-block of the third embodiment of the laser assembly.

Additionally, as shown in FIG. 24, because ports 130 and 132 and cross-channel 134 can be omitted, and because the coolant fluid can directly draw the heat from laser diodes 98 (rather than through sub-block 118), each sub-block 118 may optionally be reduced in height between top surface 64 and bottom surface 66. Preferably, each sub-block 118 retains suitable dimensions for stiffness and rigidity purposes. However, the reduced size of each sub-block 118 can reduce the overall dimensions and weight of laser assembly 12.

Moreover, to further increase the heat transfer from laser diodes 98, each laser diode 98 and sub-mount 138 can optionally be mounted in a spaced-apart manner from sub-block 118, such as with one or more offsets 152. Offsets 152 preferably hold each laser diode 98 rigidly to sub-block 118 to prevent laser diode 98 from shifting or vibrating duration operation of system 10. This spaced-apart arrangement allows the coolant fluid to also flow between sub-block 118 and laser diode 98, as illustrated by arrows 148, to further increase the exposed surface area for heat transfer. Relay optics 110 are also preferably mounted at an appropriate position for alignment with the spaced-apart laser diode 98, as shown.

Figure 25:
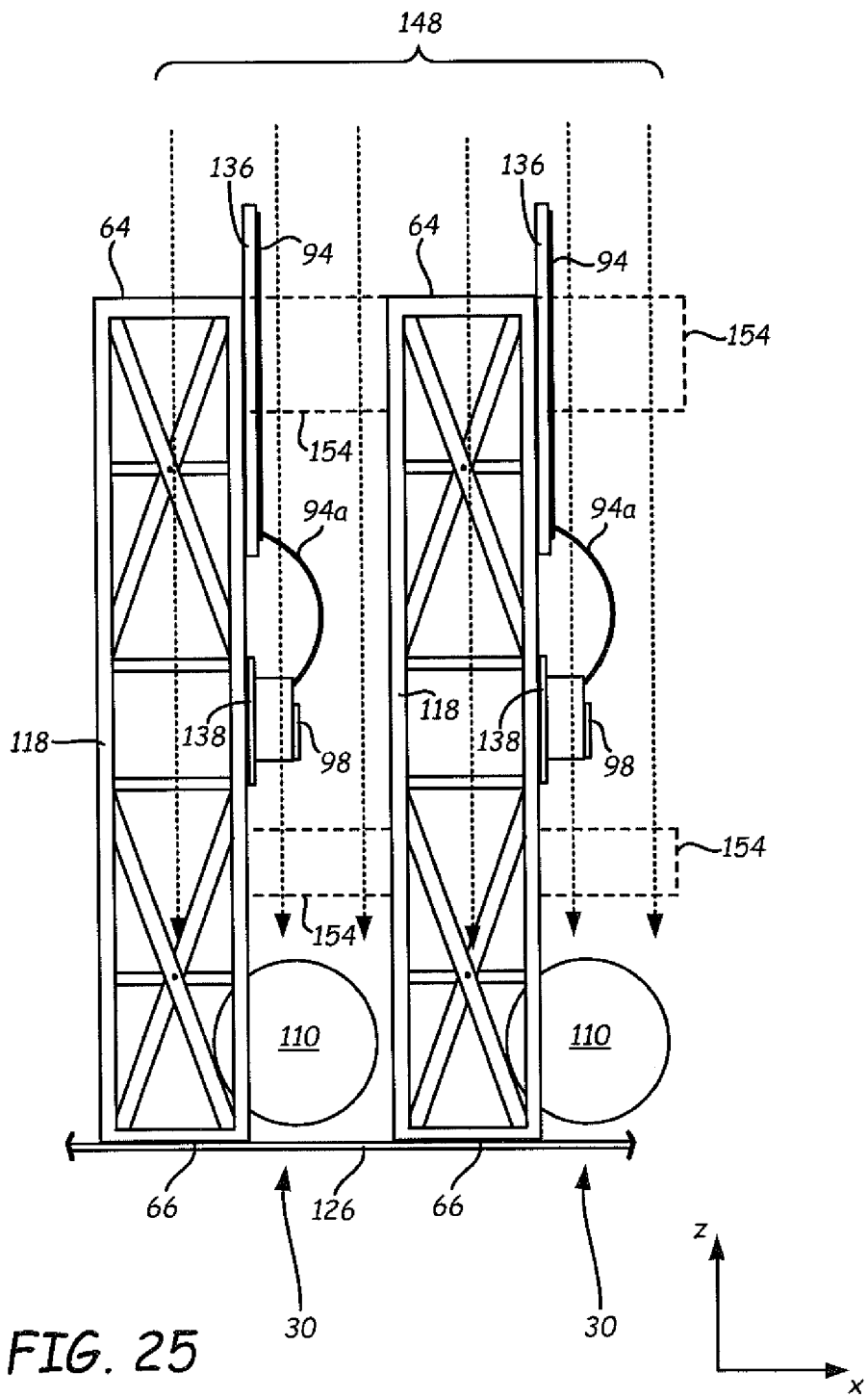
FIG. 25 is a side view of a second alternative sub-block of the third embodiment of the laser assembly.

Furthermore, as shown in FIG. 25, each sub-block 118 may alternatively have a reinforced, rigid-frame structure that preferably retains suitable dimensions for stiffness and rigidity purposes. In this embodiment, each sub-block 118 may securely retain laser emitters 30 as shown, and allows the coolant fluid to also flow through its frame structure behind laser diode 98. This can also increase the exposed surface area of laser diode 98 for heat transfer, as well as increasing the volume of the coolant fluid that sub-blocks 118 are immersed in.

The frame structures of adjacent sub-blocks 118 can be interconnected in any suitable manner, such as with reinforced, rigid offset bars 154 that can be secured to the adjacent sub-blocks 118. In effect, offset bars 154 can space adjacent sub-blocks 118 apart in the same manner as protruding bars 142 (e.g., as shown above in FIG. 23).

Laser assembly 12 in any of the above discussed embodiments in FIGS. 1-14, FIGS. 15-21, and FIGS. 22-25 can incorporate a substantial number of laser emitters 30 and associated laser channels. This can require substantial data bandwidths between controller assembly 26 and each laser emitter 30, such as about 10 gigabytes of data/second, or more. As such, as discussed above, laser assembly 12 preferably includes one or more controllers 26a and/or one or more laser control boards 72 to transfer and distribute the data.

Figure 26:
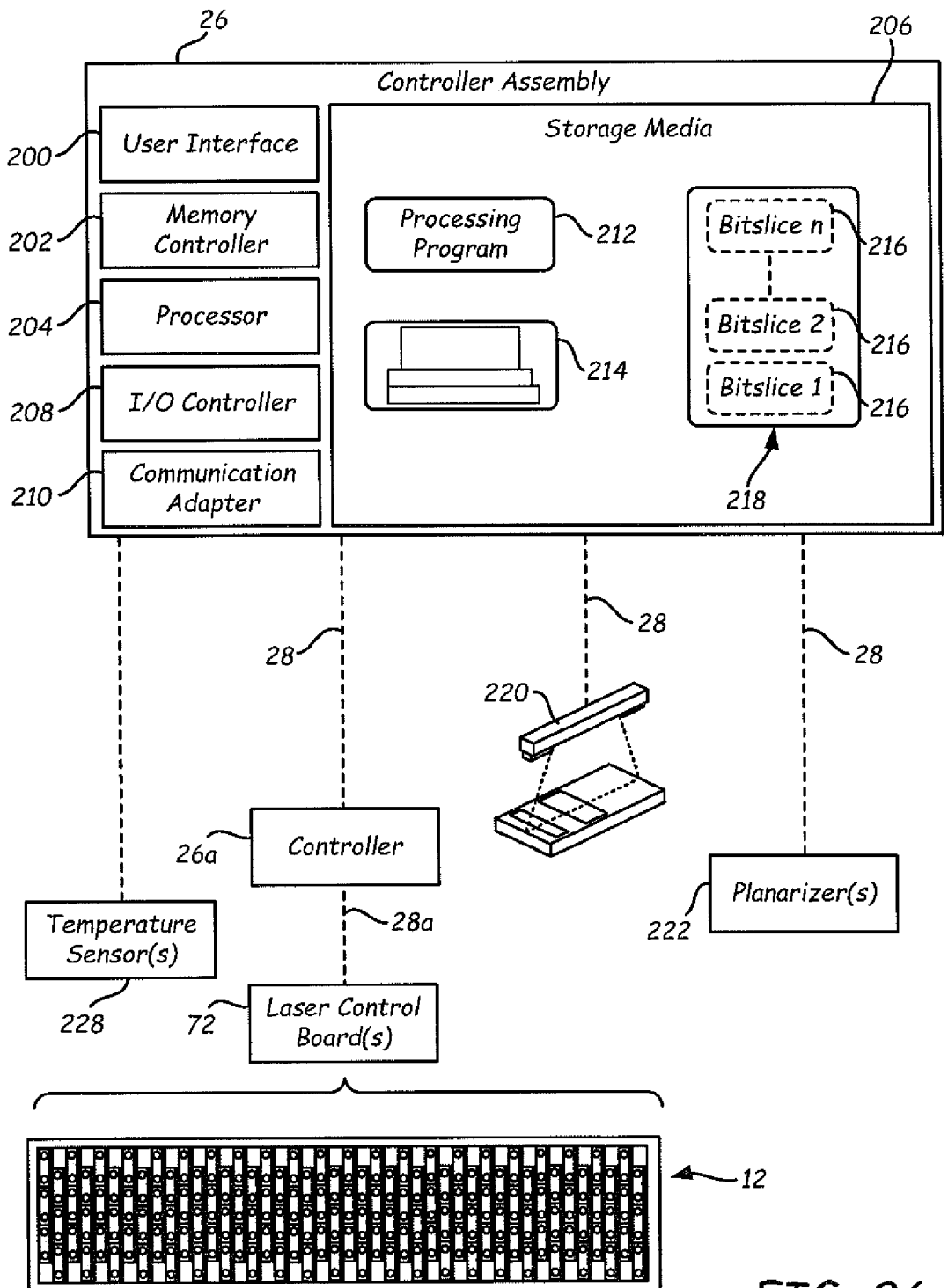
FIG. 26 is a schematic illustration of a controller assembly of the additive manufacturing system in use with the laser assembly.

FIG. 26 illustrates an exemplary architecture for controller assembly 26 for use with laser assembly 12. As shown, controller assembly 26 may include any suitable computer-based hardware, such as user interface 200, memory controller 202, processor 204, storage media 206, input/output (I/O) controller 208, and communication adapter 210. Controller assembly 26 may also include a variety of additional components that are contained in conventional computers, servers, media devices, and/or printer controllers. Controller 26a may also include similar components to controller assembly 26, such as one or more of memory controller 202, processor 204, storage media 206, input/output (I/O) controller 208, communication adapter 210, and optionally a user interface 200.

User interface 200 is an optional user-operated interface (e.g., keyboards, touch pads, touch-screen displays, display monitors, and other eye, voice, movement, or hand-operated controls) configured to operate controller assembly 26. Memory controller 202 is a circuit assembly that interfaces the components of controller assembly 26 with one or more volatile random access memory (RAM) modules of storage media 206. Processor 204 is one or more computer-processing units configured to operate controller assembly 26, optionally with memory controller 202. For instance, processor 204 may include one or more microprocessor-based engine control systems and/or digitally-controlled imaging processor systems.

Storage media 206 is one or more internal and/or external data storage devices or computer storage media for controller assembly 26, such as volatile RAM modules, read-only memory modules, optical media, magnetic media (e.g., hard disc drives), solid-state media (e.g., FLASH memory and solid-state drives), analog media, and the like. Storage media 206 may retain an executable copy of processing program 212, and may retain one or more digital models to be printed with system 10, such as digital model 214. Controller assembly 26 may receive digital model 214 over any suitable communication line, where digital model 214 may have any suitable file format, such as an STL file format.

Processing program 212 is one or more pre-processing and/or post-processing programs for optionally orienting digital model 214, slicing the oriented digital model 214 into layers, generating support structures, generating images or bitslices 216 for each layer, generating a bitslice stack 218 from the bitslices 216 and associated frame sequences, and the like.

Each bitslice 216 in bitslice stack 218 preferably has a raster graphics file format corresponding to a sliced layer of digital model 214 (and the corresponding support structure), where each bitslice 216 has a bitslice increment or thickness along the z-axis and multiple pixels in the x-y plane. Accordingly, the area of a pixel in the x-y plane and the bitslice thickness along the z-axis corresponds to a voxel of the intended printed 3D part, and is based on the printing resolution, such as 50 micrometers, 25 micrometers, or lower. As discussed above, the printing resolution is achievable by the laser packing densities and heat transfer capabilities of laser assembly 12.

The controller assembly 26 is configured to take into account the position of the individual laser emitters within the array 70 at a selected time. As the laser emitters can be individually turned on and off in a sub-microsecond interval, the part can be printed with sub-pixel timing, meaning the part can be printed with accuracy to the sub-pixel level. As such, each laser emitter can be individually controlled within a pixel, or the intensity of the laser emitter can be varied. As such the present disclosure can provide better swath direction resolution, by way of example about 256 times better resolution. The increased resolution can essentially eliminate aliasing (or stepping) of a curved surface that varies slowly in the x and/or y direction.

In some instances, part quality can be more important is some areas of the bitslice 216 where intensities can be varied by the control assembly 26 within the bitslice 216. For instance, a bulky area may require a higher intensity laser beam and finer, more delicate areas may require a lower intensity beam. The reverse may be true where bulky areas may be formed with lower intensity laser beams and finer or more delicate areas my be formed with a higher density laser beam. The present disclosure allows for the variation in beam intensity within the bitslice 216, whatever the configuration of the bitslice 216.

Suitable image file formats for bitslices 216 include bitmaps, as well as Joint Photographic Experts Group (JPEG), Tagged Image File Format (TIFF), Portable Network Graphics (PNG), and Graphics Interchange Format (GIF). As used herein, the term "bitmap" refers to a file format having one or more bits/pixel (i.e., a pixelmap). Each bitslice 216 is also preferably compressed to a standard compression format to reduce bandwidth demands. Furthermore, each bitslice 216 also preferably includes header information, such as frame sequence data, alignment offsets, best fit coefficients to the surface quadratic in the x-y build plane, and the like.

I/O controller 208 is a circuit assembly that interfaces memory controller 202, processor 204, and storage media 206 with various input and output components of controller assembly 26, including communication adapter 210. Communication adapter 210 is one or more wired or wireless transmitter/receiver adapters configured to communicate over one or more communication lines (e.g., line(s) 28).

During a printing operation, controller assembly 26 may execute processing program 212 to generate bitslices 216 and bitslice stack 218 from digital model 214, where bitslice stack 218 is stored on storage media 206. When ready, controller assembly 26 transmits successive bitslices 216 to laser assembly 12. Controller 26a and/or laser control boards 72 may then selectively and independently operate laser emitters 30 as gantry 24 moves laser assembly 12 along the x-axis, where each bitslice 216 may correspond to a single pass across platform 20. While moving along the x-axis, laser emitters 30 emit laser beams 108a on a voxel-by-voxel basis within build envelope 34. This selectively crosslinks the resin film in a predefined pattern to form a layer of the 3D part.

In some embodiments, laser assembly 12 and controller assembly 26 may also operate with an imaging sensor 220 for performing z-height measurements on the printed layers. Controller assembly 26 may then compensate for topographical error regions on a bitslice-by-bitslice basis and/or on a voxel-by-voxel basis, as discussed in Comb et al., U.S. Patent Application Publication No. 20150266242, which is incorporated by reference to the extent that it does not conflict with the present disclosure. In some embodiments, system 10 may also incorporate one or more planarizers 222 for leveling the printed layers of 3D part 48 after a preset number of layers are printed, and/or in response to information received from imaging sensor 220.

As discussed above, the large number of laser emitters 30 and the tight laser packing densities can generate substantial amounts of heat. In addition to potential damage to laser emitters 30, the generated heat can also potentially cause base block 50 to thermally expand during operation. In fact, for each Celsius-degree temperature rise, a three-meter length of base block 50 can elongate by as much as 25 micrometers, or even 50 micrometers. In other words, the thermal expansions of base block 50 can potentially offset laser emitters 30 by one or more voxel printing resolutions.

For instance, as shown in FIG. 27, the y-axis array offsets 82 and the x-axis row offsets 86 between adjacent laser emitters 30 can increase as base block 50 heats up. This is illustrated by the increased y-axis array offsets 224 and the increased x-axis row offsets 226, each which can potentially exceed the voxel printing resolution of laser assembly 12.

For the increased y-axis array offsets 224, these deviations from the original y-axis array offsets 82 can result in laser beams 108a being emitted at incorrect positions along the y-axis. Correspondingly, for the increased x-axis row offsets 226, these deviations from the original x-axis row offsets 86 can result in laser beams 108a being emitted at incorrect times as laser assembly 12 traverses along the x-axis. This accordingly results in laser beams 108a being emitted at incorrect positions along the x-axis.

Moreover, the thermal profile along base block 50 can potentially vary, which can result in a non-uniform thermal expansion across base block 50. As such, the increased y-axis array offsets 224 between laser arrays $70_i$ and $70_{i+1}$ may differ from those of laser arrays $70_{i+5}$ and $70_{i+6}$. The same effect can also occur between the rows of laser emitters 30 along the x-axis.

These conditions can significantly reduce the printing accuracies of system 10, even if heat sink assembly 74 keeps base block 50 from heating up by more than a few degrees Celsius. As such, controller assembly 26 may also modify the pixel locations in one or more bitslices 216 to compensate for the spot-to-spot spacing changes due to these thermal expansions of base block 50.

This may be accomplished, for example, by calibrating laser assembly 12 and measuring the x-y emission locations of laser beams 108a as laser assembly 12 continues to operate. The spot-to-spot spacing changes over time as base block 50 heats up can then be mapped as a function of laser operating time, which can correspond to the changing temperatures of base block 50. Alternatively (or additionally), base block 50 may be monitored with one or more temperature sensors (e.g., temperature sensors 158, shown above in FIG. 26), such as one or more thermocouples and/or infrared emission cameras. This allows the temperature(s) of base block 50 to be measured along with the measuring the emission locations of laser beams 108*a* as laser assembly 12 continues to operate.

Controller assembly 26 may then modify one or more bitslices 216 based on the mapped emission locations of laser beams 108*a* over operating time. These modifications accordingly adjust the emission patterns and timings of laser emitters 30 as laser assembly 12 traverses back-and-forth across platform 20. This can effectively correct the spot-to-spot spacing changes over time as base block 50 heats up. This mapping of laser assembly 12 can be performed at any suitable times, such as prior to installing laser assembly 12 to system 10, at set time intervals between printing operations with system 10, and/or prior to each printing operation. In some embodiments, the modifications to subsequent bitslices 216 can be performed in real-time, where temperature sensor(s) 228 can monitor the temperature(s) of base block 50 during operation, and controller assembly 26 can then modify subsequent bitslices 216 based on the monitored temperatures.

Alternatively, imaging sensor 220 can also optionally be used to measure the x-y emission locations of laser beams 108 after one or more layers are printed, and preferably after each layer is printed. Controller assembly 26 can then compare the imaged printed voxels for each layer to their intended locations in bitslices 216. Controller assembly 26 can then correct any spot-to-spot spacing changes in the x-y that occur over time (e.g., due to base block 50 heating up) by modifying subsequent bitslices 216.

Furthermore, controller assembly 26 can optionally modify bitslices 216 and the operations of laser assembly 12 for a variety of purposes to improve part quality and/or to preserve the operating life of laser assembly 12, for example. For instance, in some cases it can be useful to change the laser beam emission times and/or intensities, and/or the movement speed along the x-axis, based on the geometry of 3D part 38. Additionally, these factors can be changed as a function of operating time, such as, for example, by reducing the laser beam emission times and/or intensities as 3D part 48 grows in a layer-by-layer manner. This can assist in heat dissipation properties for laser assembly 12.

The above-discussed embodiments for system 10 and laser assembly 12 focus on their use with a photocurable resin. Suitable photocurable resins for use with system 10 and laser assembly 12 include those used in stereolithography-based systems. For example, the photocurable resin may include one or more monomers, oligomers, and/or polymers capable of crosslinking, such as one or more vinyl compounds, urethane-based compounds, (meth)acrylate compounds, epoxy compounds, epoxy-acrylate compounds, and combinations thereof. The photocurable resin also preferably includes one or more photoinitiators receptive to the ultraviolet radiation from laser beams 108*a*.

In alternative embodiments, system 10 and laser assembly 12 may be configured to operate in a particle sintering manner, such as for an additive manufacturing laser sintering and/or laser melting process. In these embodiments, laser diodes 98 are preferably configured to emit laser beams 108 in the infrared-wavelength spectrum to sintering and/or melt powder-based layers (rather than resin-based layer).

These sintering/melting applications can require significantly more optical power from laser emitters 30 compared to ultraviolet-curing applications. In fact, the sintering applications can require up to three kilowatts of optical power. However, the infrared laser emitter 30 can exhibit power efficiencies up to about 70% (compared to about 10% power efficiency for an ultraviolet laser emitter 30). As such, the infrared laser emitter 30 can generate substantially less waste heat per optical watt compared to the ultraviolet laser emitters 30. As such, the above-embodied heat sink assemblies 74 can also effectively remove the waste heat from the infrared laser emitter 30.

Suitable powder materials for this sintering/melting application include thermoplastic and metal-based powders used for selective laser sintering, selective laser melting, and direct laser melting processes. The powders may be applied across platform 20 for each layer using conventional powder delivery systems, such as roller-based delivery systems used in selective laser sintering systems.

Alternatively, system 10 may incorporate one or more electrostatic applicators that can deposit the powders electrostatically at high speeds, even up to speeds of about 100 inches/second. As such, system 10 may include electrostatic applicators, each one mounted on the leading and trailing ends of laser assembly 12 for bidirectional printing. In these embodiments, controller assembly 26 may command electrostatic applicators to electrostatically deposit the powders to form powder films after (and/or before) laser assembly 12 traverses across platform 20.

Although the present disclosure has been described with reference to preferred embodiments, workers skilled in the art will recognize that changes may be made in form and detail without departing from the spirit and scope of the disclosure.

The invention claimed is:

1. An additive manufacturing system comprising:
a build platen configured to receive a layer of consumable material for building a 3D object;
a platen gantry configured to move the build platen along a first axis;
a laser assembly comprising:
a base block comprising a plurality of sub-blocks, wherein each sub-block
comprises a plurality of laser emitters and a fluid channel, wherein the sub-blocks are interconnected such that the laser emitters of sub-blocks are arranged in arrays of two or more rows having two or more laser emitters; and
a laser gantry configured to move the laser assembly along a scan length axis such that each of the plurality of laser emitters traverses across the build platen;
a heat sink assembly at least partially retained by the laser assembly, and configured to draw heat away from the base block, the plurality of laser emitters, or both;
a controller assembly configured to operate the build platen, the laser assembly, and the laser gantry, wherein the controller assembly independently controls a timing and duration of each beam emitted from each laser emitter of the plurality of laser emitters as the laser assembly moves along the scan length axis over the build platen to print three-dimensional parts on the platen in a layer-by-layer manner by accounting for the position of the laser emitters within the plurality of laser emitters at a selected time and emitting laser beams on a voxel-by-voxel basis to selectively crosslink the consumable material in a predefined voxel pattern, such that a layer of the 3D object is formed in the predefined voxel pattern based on a plurality of digital bitslices;
wherein after each layer of the 3D object is formed, the controller assembly is further configured to:

measure an emission location of each laser emitter along the most recently formed layer of the 3D object;

measure a temperature of the base block with a temperature sensor;

compare the measured emission location to a desired emission location for each laser emitter;

modify a digital bitslice of the plurality of digital bitslices corresponding to a subsequent layer of the 3D object based on the measured temperature of the base block;

move the build platen along the first axis such that a new layer of the consumable material is applied on top of the formed layers of the 3D object; and control the laser assembly to selectively crosslink each new layer of the consumable material to print 3D object on the platen in a layer-by-layer manner;

wherein the heat sink assembly comprises one or more manifolds and one or more heat exchangers, wherein the one or more manifolds are configured to relay a circulating coolant liquid between the one or more heat exchangers and the base block.

2. The additive manufacturing system of claim 1 and wherein the consumable material comprises an unset photocurable resin and wherein the plurality of laser emitters emits ultraviolet light.

3. The additive manufacturing system of claim 1, wherein the consumable material comprises a thermoplastic.

4. The additive manufacturing system of claim 1, wherein the laser gantry is configured to move the laser assembly along a swath width axis substantially normal to the scan length axis to compensate for failed laser emitters.

5. The additive manufacturing system of claim 1, wherein the base block compositionally comprises a thermally-conductive material.

6. The additive manufacturing system of claim 1, wherein at least one or more of the laser emitters each comprise a laser chip configured to generate a laser beam, and relay optics configured to demagnify and image the laser beam.

7. The additive manufacturing system of claim 6, wherein each laser chip is oriented such that each generated laser beam has an elliptical cross section with a long direction oriented substantially normal to the scan length axis.

8. The additive manufacturing system of claim 1 and wherein the consumable material comprises a powder and wherein the plurality of laser emitters emits infrared light to heat the powder.

9. The additive manufacturing system of claim 8, and further comprising an electrostatic applicator for depositing the powder.

* * * * *